(12) United States Patent
Adachi et al.

(10) Patent No.: US 10,270,023 B2
(45) Date of Patent: Apr. 23, 2019

(54) THERMOELECTRIC MATERIAL, THERMOELECTRIC MODULE, OPTICAL SENSOR, AND METHOD FOR MANUFACTURING THERMOELECTRIC MATERIAL

(71) Applicant: SUMITOMO ELECTRIC INDUSTRIES, LTD., Osaka-shi, Osaka (JP)

(72) Inventors: Masahiro Adachi, Itami (JP); Yoshiyuki Yamamoto, Itami (JP)

(73) Assignee: Sumitomo Electric Industries, Ltd., Osaka-shi, Osaka (JP)

(*) Notice: Subject to any disclaimer, the term of this patent is extended or adjusted under 35 U.S.C. 154(b) by 115 days.

(21) Appl. No.: 15/037,064

(22) PCT Filed: Nov. 17, 2014

(86) PCT No.: PCT/JP2014/080325
§ 371 (c)(1),
(2) Date: May 17, 2016

(87) PCT Pub. No.: WO2015/093207
PCT Pub. Date: Jun. 25, 2015

(65) Prior Publication Data
US 2016/0300994 A1    Oct. 13, 2016

(30) Foreign Application Priority Data

Dec. 16, 2013  (JP) ................ 2013-259283
Jun. 30, 2014  (JP) ................ 2014-134141

(51) Int. Cl.
H01L 35/30    (2006.01)
H01L 35/26    (2006.01)
(Continued)

(52) U.S. Cl.
CPC ............ *H01L 35/26* (2013.01); *H01L 35/22* (2013.01); *H01L 35/34* (2013.01)

(58) Field of Classification Search
CPC ................ H01L 35/00–35/34; H01L 27/16
(Continued)

(56) References Cited

U.S. PATENT DOCUMENTS 5,886,390 A    3/1999  Nishimoto et al.
6,444,896 B1*  9/2002  Harman ............ B82Y 10/00
                                          136/203
(Continued)

FOREIGN PATENT DOCUMENTS

JP    H10-32353 A      2/1998
JP    H11-317548 A    11/1999
(Continued)

OTHER PUBLICATIONS

L. D. Hicks, et al., "Effect of quantum-well structures on the thermoelectric figure of merit," Physical Review B, vol. 47, No. 19 (1993) 12 727.
(Continued)

*Primary Examiner* — Bach T Dinh
(74) *Attorney, Agent, or Firm* — Drinker Biddle & Reath LLP

(57) ABSTRACT

A thermoelectric material includes a plurality of first semiconductor members having first band gap energy and a second semiconductor member having second band gap energy higher than the first band gap energy. The first semiconductor member and the second semiconductor member are alternately arranged in a direction of carrier transport. The first semiconductor member has a width in the direction of carrier transport not greater than 5 nm and a distance between two adjacent first semiconductor members in the direction of carrier transport is not greater than 3 nm.

10 Claims, 17 Drawing Sheets

(51) Int. Cl.
*H01L 35/22* (2006.01)
*H01L 35/34* (2006.01)

(58) Field of Classification Search
USPC .................................................. 136/200–242
See application file for complete search history.

(56) References Cited

U.S. PATENT DOCUMENTS

| | | | |
|---|---|---|---|
| 2002/0026856 A1 | 3/2002 | Suzuki et al. | |
| 2006/0102224 A1* | 5/2006 | Chen ..................... | H01L 35/16 136/203 |
| 2007/0289315 A1* | 12/2007 | Larsson ................. | F25B 21/00 62/3.3 |
| 2008/0087314 A1* | 4/2008 | Xiao ..................... | H01L 35/16 136/201 |
| 2009/0314324 A1* | 12/2009 | Murai .................... | H01L 35/18 136/201 |
| 2011/0132422 A1* | 6/2011 | Yajima ................... | H01L 35/32 136/211 |
| 2013/0000688 A1* | 1/2013 | Cho ....................... | H01L 35/32 136/200 |

FOREIGN PATENT DOCUMENTS

| | | |
|---|---|---|
| JP | 2002-076452 A | 3/2002 |
| JP | 2002-151748 A | 5/2002 |
| JP | 2005-506693 A | 3/2005 |
| JP | 2010-056160 A | 3/2010 |
| JP | 2010-101675 A | 5/2010 |
| JP | 2012-068106 A | 4/2012 |
| WO | WO 03/032408 A1 | 4/2003 |

OTHER PUBLICATIONS

L. D. Hicks, et al., "Thermoelectric figure of merit of a one-dimensional conductor," Physical Review B, vol. 47, No. 24 (1993) 16 631.

L. D. Hicks, et al., "Experimental study of the effect of quantum-well structures on the thermoelectric figure of merit," Physical Review B, vol. 53, No. 16 (1996) R10 493.

H. Takiguchi, et al., "Nano Structural and Thermoelectric Properties of SiGeAu Think Films," Japanese Journal of Applied Physics 50 (2011) 041301.

* cited by examiner

FIG.25
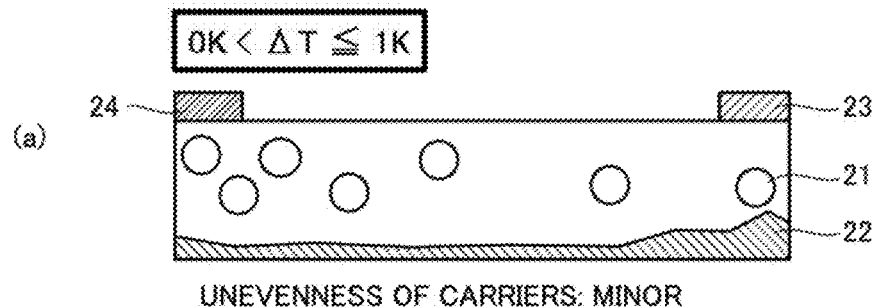
(a) UNEVENNESS OF CARRIERS: MINOR
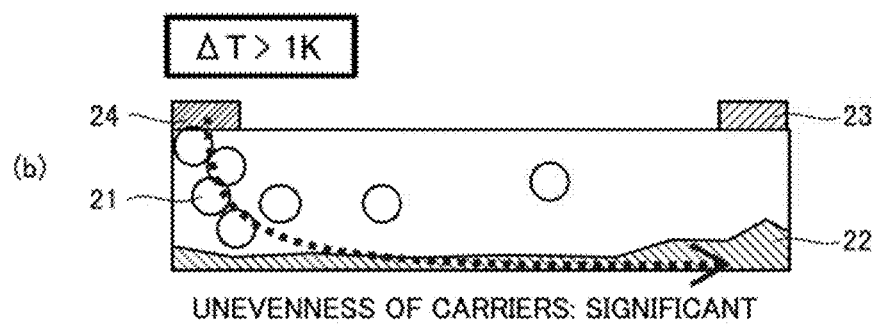
(b) UNEVENNESS OF CARRIERS: SIGNIFICANT FIG.26
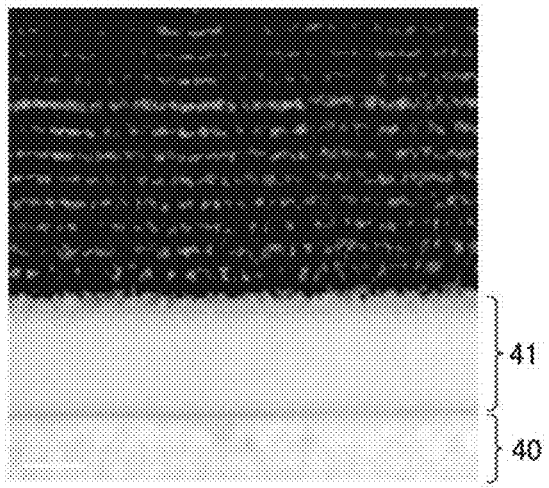
(a)
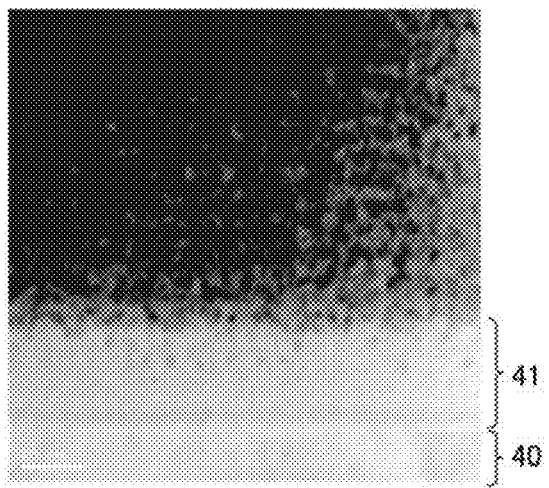
(b)

THERMOELECTRIC MATERIAL, THERMOELECTRIC MODULE, OPTICAL SENSOR, AND METHOD FOR MANUFACTURING THERMOELECTRIC MATERIAL

TECHNICAL FIELD

This invention relates to a thermoelectric material constituted of nanostructures and a thermoelectric module and an optical sensor including the same, as well as a method for manufacturing a thermoelectric material constituted of nanostructures.

BACKGROUND ART

A thermoelectric material converts a temperature difference (thermal energy) into electric energy, and conversion efficiency η thereof is expressed in an expression (1) below.

$$\eta = \frac{\Delta T}{Th} \frac{M-1}{M + \frac{Tc}{Th}} \quad (1)$$

In the expression (1) above, Th represents a temperature on a high-temperature side, Tc represents a temperature on a low-temperature side, and ΔT represents a temperature difference between Th and Tc (=Th−Tc). M is given in an expression (2) below, using a dimensionless performance index ZT representing an index representing performance of a thermoelectric material. This dimensionless performance index ZT is a value obtained by multiplying a performance index Z by an absolute temperature T, and expressed in an expression (3) below.

$$M = \sqrt{1+ZT} \quad (2)$$

$$ZT = \frac{S^2 \sigma T}{\kappa} \quad (3)$$

In the expression (3) above, S represents a Seebeck coefficient (V/K) of a thermoelectric material, σ represents a conductivity (S/m) of a thermoelectric material, and κ represents a thermal conductivity (W/mK) of a thermoelectric material. Z has a dimension defined by a reciprocal of a temperature, and ZT obtained by multiplying this performance index Z by absolute temperature T has a dimensionless value.

Conversion efficiency η given in the expression (1) is a monotonically increasing function of dimensionless performance index ZT. Therefore, increase in dimensionless performance index ZT is a key for improvement in performance. Conventionally, however, dimensionless performance index ZT has remained around 1, and a result exceeding this has not been reported.

It has recently been known (for example, L. D. Hicks et al., PRB 47 (1993) 12727 (NPD 1) and L. D. Hicks et al., PRB 47 (1993) 16631 (NPD 2)) or demonstrated (for example, L. D. Hicks et al., PRB 53 (1996) R10493 (NPD 3)) that Seebeck coefficient S and thermal conductivity κ can be controlled by lowering a dimension of carriers (free electrons or free holes) and increasing phonon scattering owing to quantum wells and quantum wires.

A thermoelectric material in which carriers have further been lowered in dimension by forming particles has been known (Japanese Patent Laying-Open No. 2002-76452 (PTD 1)). The thermoelectric material, however, may suffer from lowering in conductivity, because an insulator buries a gap between particles.

Furthermore, it has been reported as another example of a lower dimension of carriers (H. Takiguchi et al., JJAP 50 (2011) 041301 (NPD 4)) that by forming nanoparticles of SiGe in a thin film of silicon germanium gold (SiGeAu) by annealing the thin film, thermoelectric characteristics are improved as compared with bulk SiGe.

CITATION LIST

PATENT DOCUMENT

PTD 1: Japanese Patent Laying-Open No. 2002-76452

NON PATENT DOCUMENT

NPD 1: L. D. Hicks et al., PRB 47 (1993) 12727
NPD 2: L. D. Hicks et al., PRB 47 (1993) 16631
NPD 3: L. D. Hicks et al., PRB 53 (1996) R10493
NPD 4: H. Takiguchi et al., JJAP 50 (2011) 041301

SUMMARY OF INVENTION

Technical Problem

The present inventor has conducted dedicated studies about the methods described in NPDs 1 to 3, and found that a thermoelectric material has such a structure that carriers are transported in a direction perpendicular to a direction of quantization, and hence a sufficient quantum effect, that is, quantal increase in density of states, has not been obtained. Therefore, a Seebeck coefficient has not sufficiently been improved.

In the method described in NPD 4, phonon scattering can be improved and thermal conductivity can be lowered by formed nanoparticles, however, a Seebeck coefficient has not sufficiently been improved. A factor therefor may be that, in NPD 4, though a size of nanoparticles can be controlled by varying a concentration of Au, an interval between nanoparticles cannot be controlled. Therefore, wave functions cannot be combined between nanoparticles and hence a conductivity is low.

This invention was made to solve such problems, and an object of this invention is to realize higher thermoelectric characteristics of a thermoelectric material constituted of nano structures.

Solution to Problem

A thermoelectric material according to one embodiment of the present invention includes a plurality of first semiconductor members having first band gap energy and a second semiconductor member having second band gap energy higher than the first band gap energy. The first semiconductor member and the second semiconductor member are alternately arranged in a direction of carrier transport. The first semiconductor member has a width in the direction of carrier transport not greater than 5 nm and a distance between two adjacent first semiconductor members in the direction of carrier transport is not greater than 3 nm.

Advantageous Effects of Invention

According to the above, a thermoelectric material constituted of nanostructures, which exhibits excellent thermoelectric characteristics, can be realized.

BRIEF DESCRIPTION OF DRAWINGS

FIG. 25 is a diagram showing (a) a model in a case that a temperature difference is not more than 1 K and (b) a model in a case that a temperature difference is more than 1 K, for sample 6.

FIG. 26 is a diagram showing (a) a bright-field STEM image before an annealing step and (b) a bright-field STEM image after the annealing step, for a sample in Example 1.

DESCRIPTION OF EMBODIMENTS

Figure 1:
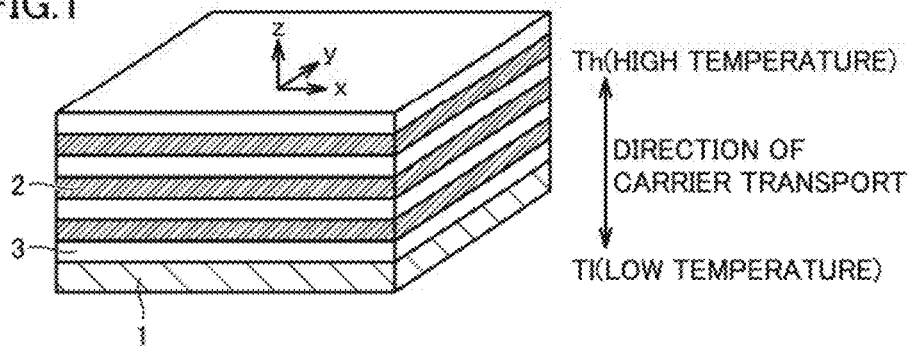
FIG. 1 is a perspective view schematically showing a thermoelectric material having a quantum well structure.

[Description of Embodiment of Invention of Present Application]

Embodiments of the invention of the present application will initially be listed and described.

(1) A thermoelectric material according to one embodiment of the present invention includes a plurality of first semiconductor members having first band gap energy and a second semiconductor member having second band gap energy higher than the first band gap energy. The first semiconductor member and the second semiconductor member are alternately arranged in a direction of carrier transport. The first semiconductor member has a width in the direction of carrier transport not greater than 5 nm and a distance between two adjacent first semiconductor members in the direction of carrier transport is not greater than 3 nm.

Thus, since a direction of quantization in a thermoelectric material constituted of nanostructures can be the same as the direction of carrier transport in the thermoelectric material, a quantum effect can be taken into control of a conductivity and a Seebeck coefficient. Based on this finding, the present inventor has studied an optimal structure which can exhibit the quantum effect, and found that the quantum effect is effectively exhibited and excellent thermoelectric characteristics can be achieved in a structure in which a crystal size of quantization is not greater than 5 nm and a distance between adjacent crystals in the direction of carrier transport is not greater than 3 nm.

(2) In the thermoelectric material according to (1), preferably, the first semiconductor member forms quantum dots having a particle size not greater than 5 nm and the second semiconductor member forms a base material in which the quantum dots are distributed. Thus, the thermoelectric material has a quantum network (net) structure in which quantum dots (nanoparticles) are distributed in a base material. In the structure, a particle size of the quantum dots corresponds to a width of the quantum dots in the direction of carrier transport. By setting a particle size of the quantum dots to 5 nm or smaller, a quantum effect is noticeable and hence good thermoelectric characteristic are realized.

(3) In the thermoelectric material according to (2), preferably, an interparticle distance between the quantum dots is not greater than 3 nm. Thus, the thermoelectric material has a quantum network structure in which quantum dots having a particle size not greater than 5 nm are arranged as being distributed in a base material at an interparticle distance not greater than 3 nm. In the structure, an interparticle distance between quantum dots corresponds to a distance between quantum dots in the direction of carrier transport. By setting an interparticle distance between quantum dots to 3 nm or smaller, wave functions can be combined between two adjacent quantum dots and hence the quantum effect is effective and good thermoelectric characteristic are realized.

(4) In the thermoelectric material according to (2) or (3), preferably, the quantum dots are nanoparticles containing a base material element and a different element different from the base material element. The base material element includes Si and Ge and the different element includes Au, Cu, B, or Al. Thus, nanoparticles of SiGe containing Au, Cu, B, or Al are formed in the base material composed of Si and Ge (amorphous SiGe, amorphous Ge, or amorphous Si).

(5) In the thermoelectric material according to any of (1) to (4), preferably, a ratio of crystallization of the thermoelectric material is not lower than 45%. Thus, since the thermoelectric material has a quantum network structure in which the base material contains many nanoparticles, the quantum effect is exhibited and good thermoelectric characteristics can be realized.

(6) In the thermoelectric material according to any of (1) to (5), preferably, an image obtained by subjecting an image resulting from observation of the thermoelectric material with a transmission electron microscope to fast Fourier transform has a moire. The FFT image of the TEM image shows that the thermoelectric material has a structure including many nanoparticles of which crystallographic axes are aligned in a direction of passage of electron beams. Thus, the quantum effect is exhibited and good thermoelectric characteristics can be realized.

(7) In the thermoelectric material according to (2) or (3), preferably, the quantum dots are nanoparticles containing a base material element and a different element different from the base material element. The thermoelectric material further includes a support portion for supporting the nanoparticles. The support portion is preferably formed of a material capable of forming a solid solution of the different element. Thus, when the different element diffuses through annealing treatment for forming nanoparticles, the different element can diffuse also in the support portion. Therefore, precipitation of the different element as being concentrated in a specific portion, in particular, in a portion of the base material in contact with a substrate, can be prevented. Therefore, lowering in thermoelectric characteristics due to a leak path formed by this specific portion can be prevented.

(8) The thermoelectric material according to (7) preferably further includes a substrate having the nanoparticles formed on a main surface. The support portion is provided between the main surface of the substrate and the nanoparticles. Since the different element can thus diffuse between the nanoparticles and the substrate, precipitation of the different element as being concentrated in a specific portion, in particular, in a portion of the nanostructures in contact with the substrate, can be prevented.

(9) The thermoelectric material according to (7) preferably further includes a substrate body having the nanoparticles formed on a main surface. The support portion is at least provided in an uppermost portion of the substrate body including the main surface. Thus, the different element can diffuse also in the substrate body, and precipitation of the different element as being concentrated in a specific portion, in particular, in a portion of contact between the nanostructures and the substrate body, can be prevented.

(10) In the thermoelectric material according to any of (7) to (9), preferably, the different element is diffused in the support portion. Thus, precipitation of the different element as being concentrated in a specific portion, in particular, in a portion of the nanostructures in contact with the substrate body, can be prevented. Therefore, lowering in thermoelectric characteristics due to a leak path formed by the specific portion can be prevented.

(11) In the thermoelectric material according to (1), preferably, the first semiconductor member forms a quantum wire having a wire diameter not greater than 5 nm and the second semiconductor member forms an energy barrier layer covering a surface of the quantum wire and having a thickness not greater than 1.5 nm. The thermoelectric material has a structure in which a plurality of quantum wires having a wire diameter not greater than 5 nm are arranged at a distance not greater than 3 nm in the direction of carrier transport. Thus, the thermoelectric material realizes good thermoelectric characteristics by exhibiting a sufficient quantum effect.

(12) A thermoelectric module according to one embodiment of the present invention includes a thermoelectric element and a pair of insulator substrates sandwiching the thermoelectric element. The thermoelectric element includes the thermoelectric material according to any of (1) to (11), which is doped to a p-type or an n-type, and an electrode joined to the thermoelectric material in the direction of carrier transport. Though the electrode is preferably perpendicular to a direction of a temperature difference, it does not necessarily have to be perpendicular thereto. Thus, a thermoelectric module achieving high efficiency and high reliability can be realized by including a thermoelectric material having excellent thermoelectric characteristics.

(13) An optical sensor according to one embodiment of the present invention includes an absorber configured to absorb light and convert light to heat and a thermoelectric converter connected to the absorber. The thermoelectric converter includes the thermoelectric material according to any of (1) to (11), which is doped to a p-type or an n-type. Thus, an optical sensor high in performance can be realized by including a thermoelectric material having excellent thermoelectric characteristics.

(14) A method for manufacturing a thermoelectric material according to one embodiment of the present invention is a manufacturing method for manufacturing a thermoelectric material which includes a base material composed of a base material element and quantum dots fabricated with the base material element and a different element different from the base material element being involved, and the manufacturing method includes the steps of alternately stacking a first layer containing the different element and a second layer not containing the different element and forming the quantum dots in the base material by subjecting a stack of the first layer and the second layer to annealing treatment. The quantum dots formed in the annealing treatment have an average particle size not greater than 5 nm and an average interparticle distance not greater than 3 nm. Since the thermoelectric material constituted of nano structures manufactured with the manufacturing method can exhibit a sufficient quantum effect, it can realize excellent thermoelectric characteristics.

(15) In the manufacturing method according to (14), preferably, the base material element includes Si and Ge and the different element includes Au, Cu, B, or Al.

(16) In the manufacturing method according to (15), preferably, the first layer contains Ge as the base material element and the second layer contains Si as the base material element. Thus, nanoparticles of SiGe fabricated with Au, Cu, B, or Al being involved are formed in the base material composed of Si and Ge (amorphous SiGe, amorphous Ge, or amorphous Si).

(17) In the manufacturing method according to any of (14) to (16), preferably, the stacking step is a step of alternately stacking the first layer and the second layer on a substrate body. An uppermost portion of the substrate body in contact with the first layer or the second layer is formed of a material capable of forming a solid solution of the different element. According to such a construction, in diffusion of the different element through annealing treatment, the different element can diffuse also in the substrate body and precipitation of the different element as being concentrated in a specific portion, in particular, in a portion of the first layer in contact with the substrate body, can be prevented. Since formation of a leak path by such a specific portion can be prevented, a high Seebeck coefficient can be obtained even when a temperature difference caused in the thermoelectric material is increased.

(18) In the manufacturing method according to (17), preferably, the uppermost portion of the substrate body is formed of Si, a semiconductor, glass, ceramics, or an organic substance. Thus, since the different element diffuses in the uppermost layer of the substrate body, precipitation of the different element as being concentrated in a specific portion and formation of a leak path can be prevented.

(19) In the manufacturing method according to (18), preferably, the base material element includes Si and Ge, the different element includes Au, Cu, B, or Al, and the uppermost portion of the substrate body is formed of Si. By forming the uppermost portion of Si lower in rate of diffusion of the different element than Ge, diffusion of the different element in the uppermost portion is more readily controlled.

(20) In the manufacturing method according to any of (17) to (19), preferably, the uppermost portion of the substrate body has a thickness not smaller than 5 nm. Thus, the uppermost portion can sufficiently contain the different element which diffuses under a treatment condition in an annealing step.

(21) A method for manufacturing a thermoelectric material according to one embodiment of the present invention includes the step of producing a wire by subjecting a first semiconductor material and a second semiconductor material to a diameter reduction process and bundling a plurality of wires and subjecting a resultant bundle to the diameter reduction process. The second semiconductor material is higher in band gap energy than the first semiconductor material and surrounds the first semiconductor material. The method includes the steps of further bundling a plurality of assemblies of the wires which have been subjected to the diameter reduction process, producing a nanowire array by repeating treatment for the diameter reduction process for the bundled assemblies one or more times, cutting the produced nanowire array to a prescribed length, and forming the thermoelectric material by bundling a plurality of cut nanowire arrays. In the thermoelectric material, a quantum wire formed of the first semiconductor material has an average wire diameter not greater than 5 nm and a distance between the quantum wires in a direction of carrier transport is not greater than 3 nm. Thus, a thermoelectric material is formed, which has a structure in which a plurality of quantum wires having a wire diameter not greater than 5 nm are arranged at a distance not greater than 3 nm in a direction of carrier transport.

(22) In the manufacturing method according to (21), the first semiconductor material includes Si and the second semiconductor material includes $SiO_2$. Thus, a thermoelectric material constituted of quantum wires composed of Si and an energy barrier layer composed of $SiO_2$ is formed.

[Details of Embodiment of Invention of Present Application]

An embodiment of the present invention will be described hereinafter with reference to the drawings. In the drawings below, the same or corresponding elements have the same reference characters allotted and description thereof will not be repeated.

<First Embodiment>

1. Construction of Thermoelectric Material

Figure 2:
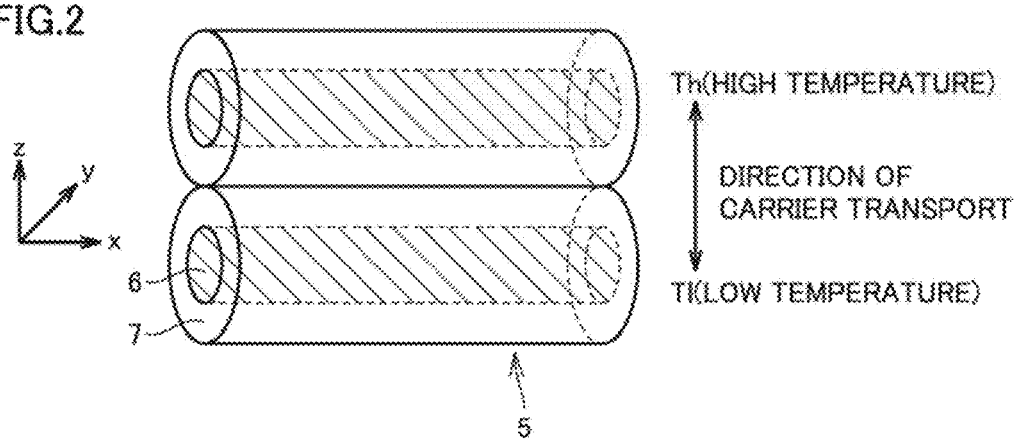
FIG. 2 is a perspective view schematically showing a thermoelectric material having a quantum wire structure.

A basic construction of a thermoelectric material according to a first embodiment of this invention will initially be described. FIG. 1 is a perspective view schematically showing a thermoelectric material having a quantum well structure. FIG. 2 is a perspective view schematically showing a thermoelectric material having a quantum wire structure.

Referring to FIG. 1, a quantum well structure is formed by alternately stacking on a main surface of a substrate 1, two semiconductor layers 2 and 3 different from each other in band gap energy. Since semiconductor layer 2 is relatively low in band gap energy, it forms a quantum well layer. Since semiconductor layer 3 is relatively high in band gap energy, it forms an energy barrier layer.

The quantum well structure is a structure in which a state that an energy level is discretized can be obtained as an electron state around a valence band and a conduction band is quantized in a one-dimensional direction (for example, in a direction of a thickness (a z direction in the drawings)). Energy of electrons in quantum well layer 2 is discretized and divided into energy states called sub bands.

Referring to FIG. 2, the quantum wire structure includes a wire 5 formed by concentrically arranging two semiconductor members 6 and 7 different from each other in band gap energy. A plurality of wires 5 are arranged in a direction perpendicular (for example, in the direction of thickness (the z direction in the drawings)) to a longitudinal direction (an x direction in the drawings). Since first semiconductor member 6 is relatively low in band gap energy in each wire 5, it forms a quantum wire. Since second semiconductor member 7 is relatively high in band gap energy, it forms an energy barrier layer.

The quantum wire structure is a structure in which a state that an energy level is discretized can be obtained as an electron state around a valence band and a conduction band is quantized in a two-dimensional direction. The quantum wire structure can have a discrete sub band structure not only in the z direction but also in a y direction, and it can effectively achieve energy conversion.

In this embodiment, a direction of quantization in the quantum well structure and the quantum wire structure is matched with a direction of carrier transport (the z direction in the drawings) in the thermoelectric material. The direction of carrier transport means a direction of migration of carriers due to a temperature difference caused in the thermoelectric material. Thus, quantal change in density of states can be taken into control of conductivity σ and Seebeck coefficient S of the thermoelectric material.

Figure 3:
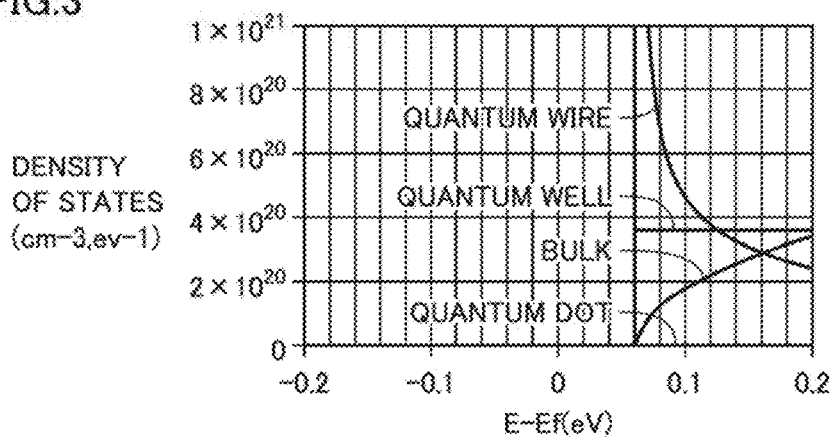
FIG. 3 is a diagram showing variation in density of states owing to a quantum effect.

FIG. 3 shows variation in density of states owing to the quantum effect. As shown in FIG. 3, with increase in energy level of electrons, density of states increases. When the quantum well structure is quantized with respect to the direction of carrier transport, quantal increase in density of states, that is, the quantum effect, can positively be taken into control of conductivity σ and Seebeck coefficient S.

Specifically, in the quantum well structure (FIG. 1) and the quantum wire structure (FIG. 2), conductivity σ and Seebeck coefficient S can be calculated with expressions (4) and (5) below.

$$\sigma(T) = \int_{-\infty}^{\infty} \frac{q^2}{3} v^2(\varepsilon)\tau(\varepsilon)N(\varepsilon)\left(-\frac{\partial f(\varepsilon, T)}{\partial \varepsilon}\right)d\varepsilon \qquad (4)$$

$$S(T) = -\frac{1}{qT}\frac{\int_{-\infty}^{\infty} \frac{q^2}{3} v^2(\varepsilon)\tau(\varepsilon)N(\varepsilon)(\varepsilon - \varepsilon f)\left(-\frac{\partial f(\varepsilon, T)}{\partial \varepsilon}\right)d\varepsilon}{\sigma(T)} \qquad (5)$$

In the expressions (4) and (5), q represents elementary charge (C), v represents a heat speed (m/s) of carriers, τ represents a relaxation time (s) of carriers, N represents density of states ($m^{-3}$), ε represents energy of carriers, εf represents Fermi energy, and f(ε, T) represents a Fermi distribution function.

Figure 4:
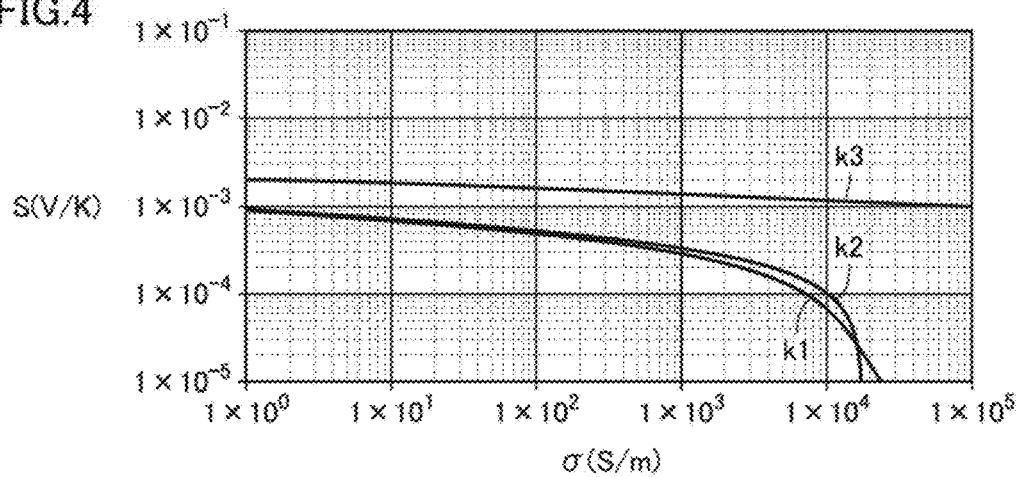
FIG. 4 is a diagram showing a result of calculation of thermoelectric characteristics of a thermoelectric material according to a first embodiment of this invention.

The density of states in a quantized state shown in FIG. 3 is taken into the expressions (4) and (5) and calculated. FIG. 4 shows a result of calculation of conductivity σ and Seebeck coefficient S. Calculation was conducted for each of a bulk structure, the quantum well structure, and the quantum wire structure.

Figure 5:
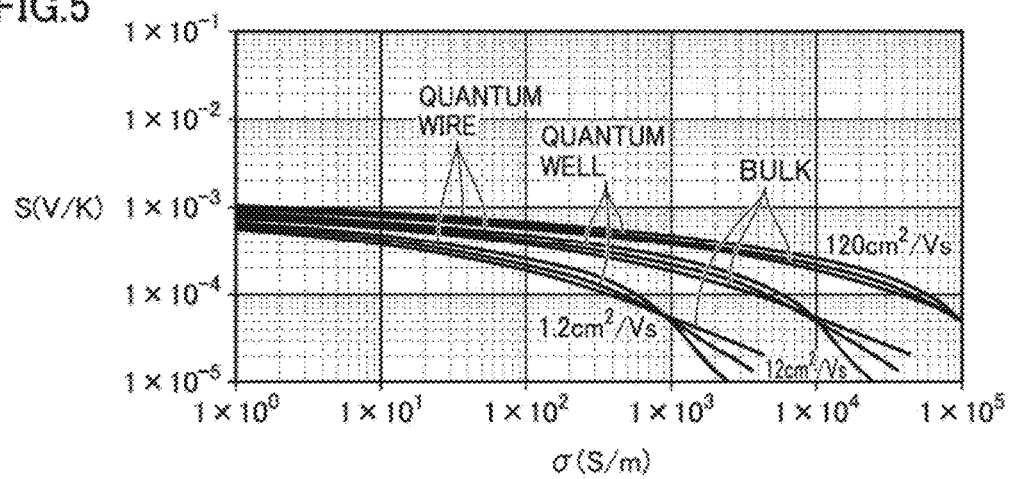
FIG. 5 is a diagram showing a result of calculation of thermoelectric characteristics of a thermoelectric material described in NPD 1.

For comparison, conductivity σ and Seebeck coefficient S in a case that variation in density of states owing to the quantum effect is not taken in were calculated, which corresponds to transport of carriers in a direction perpendicular to a direction of quantization of carriers, that is, the x and y directions in FIG. 1 or the x direction in FIG. 2. This calculation was conducted for each of the bulk structure, the quantum well structure, and the quantum wire structure, by using calculation expressions for conductivity σ and Seebeck coefficient S described in NPD 1. FIG. 5 shows results of calculation. In calculation, mobility is adopted as a variable.

In FIG. 4, the ordinate represents Seebeck coefficient S and the abscissa represents conductivity σ. In FIG. 4, k1 represents relation between Seebeck coefficient S and conductivity σ in the bulk structure, k2 represents relation between Seebeck coefficient S and conductivity σ in the quantum well structure, and k3 represents relation between Seebeck coefficient S and conductivity σ in the quantum wire structure.

In FIG. 5, the ordinate represents Seebeck coefficient S and the abscissa represents conductivity σ. FIG. 5 shows relation between Seebeck coefficient S and conductivity σ in the bulk structure, the quantum well structure, and the quantum wire structure.

Initially, referring to a comparative example in FIG. 5, with mobility being the same, relation between Seebeck coefficient S and conductivity σ of both of the quantum well structure and the quantum wire structure is substantially the same as that of the bulk structure. It can be seen from this result that a sufficient quantum effect has not been achieved. It can be seen with reference to FIG. 4 that, when variation in density of states owing to the quantum effect is taken in, Seebeck coefficient S of the quantum wire structure is better than Seebeck coefficient S of the bulk structure and the quantum well structure.

Figure 6:
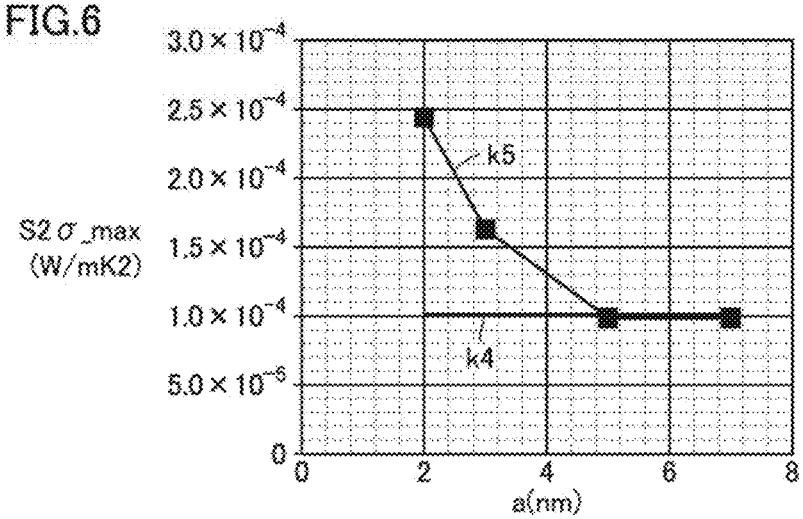
FIG. 6 is a diagram showing a result of calculation of relation between a thickness of a quantum well layer in a quantum well structure and a power factor.

Though Seebeck coefficient S of the quantum well structure remains substantially the same as Seebeck coefficient S of the bulk structure in FIG. 4, it has been confirmed that Seebeck coefficient S improves with decrease in thickness of quantum well layer 2 (FIG. 1). FIG. 6 shows a result of calculation of relation between a thickness of the quantum well layer in the quantum well structure and a power factor. The power factor corresponds to a numerator $S^2\sigma$ of dimensionless performance index ZT and represents electrical contribution of thermoelectric performance. In FIG. 6, the ordinate represents a maximal value $S^2\sigma\_max$ of the power factor and the abscissa represents a thickness a of the quantum well layer. k4 represents maximal value $S^2\sigma\_max$ of the power factor in the bulk structure and k5 represents maximal value $S^2\sigma\_max$ of the power factor in the quantum well structure. Referring to FIG. 6, when the quantum well layer has a thickness not smaller than 5 nm, the power factor of the quantum well structure is substantially the same in value as the power factor of the bulk structure. In contrast, when the quantum well layer has a thickness smaller than 5 nm, the power factor of the quantum well structure increases and exhibits a value higher than a value for the power factor of the bulk structure. It has thus been confirmed that the quantum effect is effective by setting a thickness of the quantum well layer to 5 nm or smaller in the quantum well structure.

Figure 7:
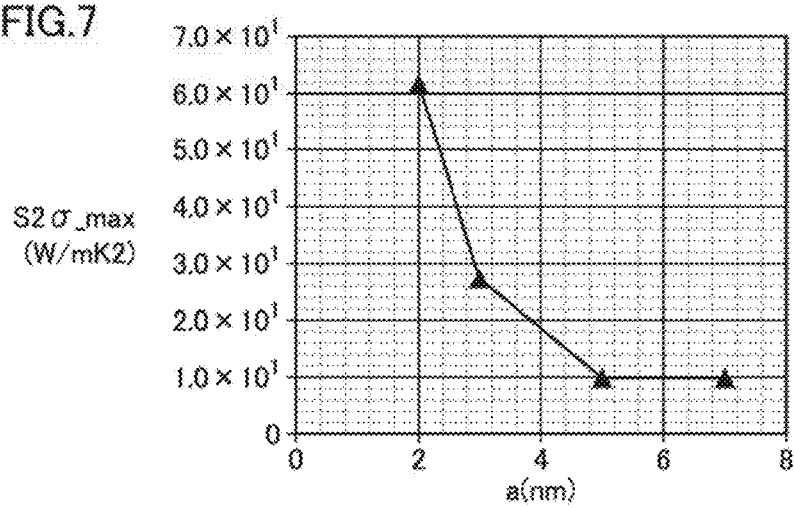
FIG. 7 is a diagram showing relation between a wire diameter of a quantum wire in a quantum wire structure and a power factor.

FIG. 7 is a diagram showing relation between a wire diameter of a quantum wire in the quantum wire structure and a power factor. The ordinate in FIG. 7 represents maximal value $S^2\sigma\_max$ of the power factor and the abscissa represents a wire diameter a of a quantum wire.

Referring to FIG. 7, the power factor exhibits a constant value when the quantum wire has a wire diameter not smaller than 5 nm, whereas the power factor is greater as the wire diameter is smaller when the quantum wire has a wire diameter smaller than 5 nm. It has thus been confirmed that the quantum effect is effective by setting a wire diameter of a quantum wire to 5 nm or smaller in the quantum wire structure.

As described above, the present inventor has found that by matching the direction of carrier transport in the thermoelectric material with a direction of quantization in the quantum well structure and the quantum wire structure, the quantum effect, that is, quantal increase in density of states, can be achieved and hence Seebeck coefficient S can be improved. Then, the present inventor has found an optimal structure for achieving a sufficient quantum effect for each of the quantum well structure and the quantum wire structure and derived the present invention. Specifically, the present inventor has found that the quantum well layer preferably has a thickness not greater than 5 nm in the quantum well structure. In addition, the present inventor has found that the quantum wire preferably has a wire diameter not greater than 5 nm in the quantum wire structure.

Figure 8:
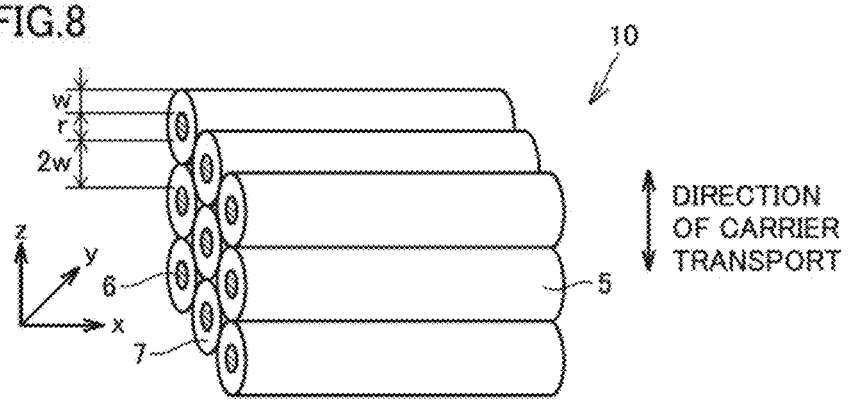
FIG. 8 is a perspective view showing a construction of the thermoelectric material according to the first embodiment of this invention.

FIG. 8 is a perspective view showing a construction of the thermoelectric material according to the first embodiment of this invention. The thermoelectric material according to this embodiment has the quantum wire structure formed based on the finding above.

Referring to FIG. 8, a thermoelectric material 10 is formed by arranging a plurality of wires 5 in directions (the z direction and the y direction) perpendicular to the longitudinal direction (the x direction). Each of the plurality of wires 5 has the quantum wire structure shown in FIG. 2.

In wire 5, a quantum wire 6 has a wire diameter r preferably not greater than 5 nm. Thus, the quantum effect can be exhibited.

An energy barrier layer 7 has a thickness w in a radial direction preferably not greater than 1.5 nm. Thickness w of energy barrier layer 7 is derived based on an existence probability of carriers in a side surface of quantum wire 6. The present inventor has found that wave functions of carriers can be combined between adjacent quantum wires 6 by setting a distance $2w$ in the direction of carrier transport between adjacent quantum wires 6 to 3 nm or smaller. Details of a thickness of energy barrier layer 7 will be described later.

2. Method for Manufacturing Thermoelectric Material

One example of a method for manufacturing a thermoelectric material according to the first embodiment of this invention will now be described with reference to FIG. 9.

Figure 9:
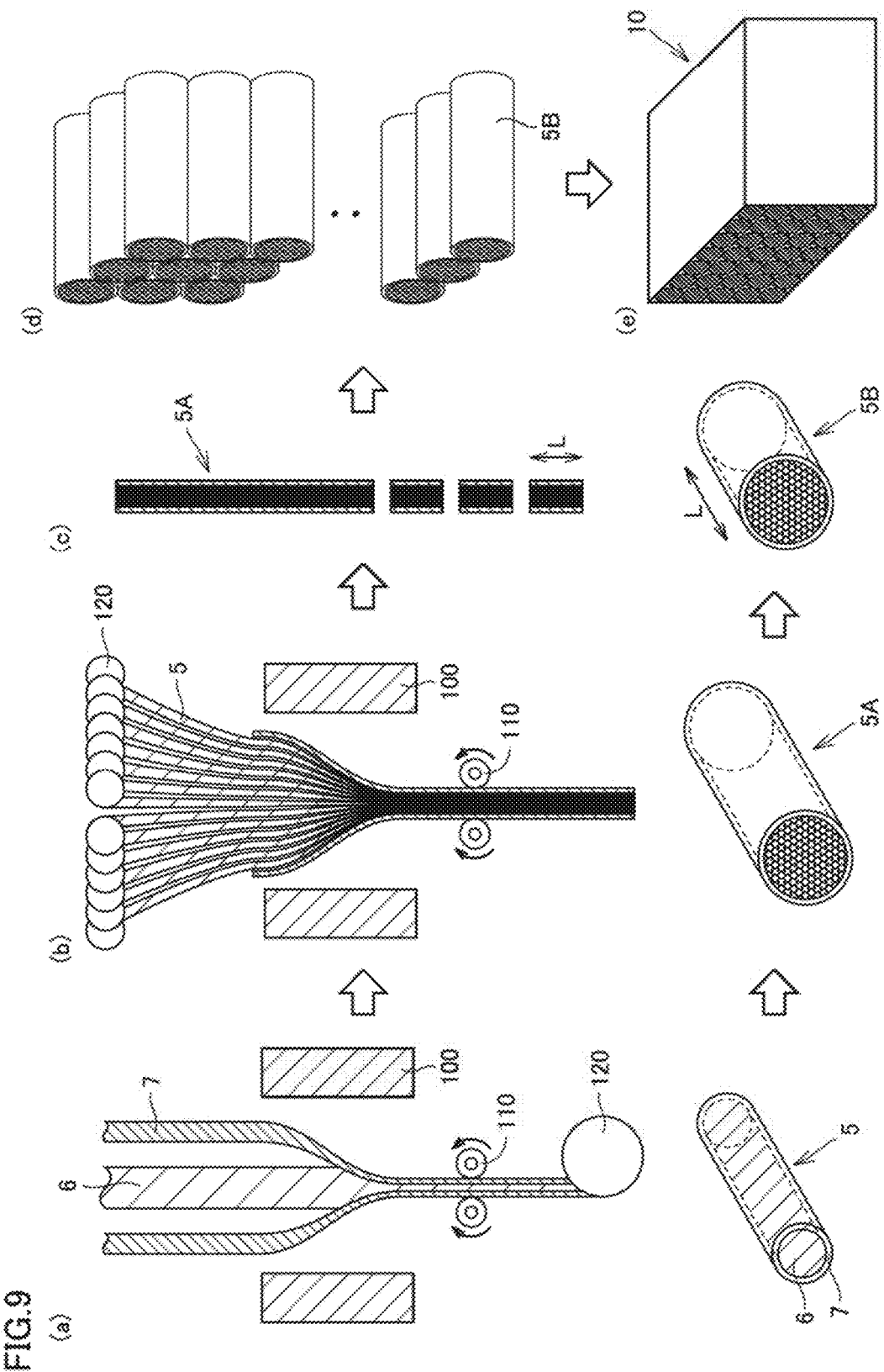
FIG. 9 is a diagram illustrating one example of a method for manufacturing a thermoelectric material according to the first embodiment of this invention.

Referring to FIG. 9, a method for manufacturing a thermoelectric material having a quantum wire structure includes the steps of producing a wire having a quantum wire structure (FIG. 9(*a*)), producing a nanowire array by bundling the plurality of wires and subjecting the wires to a diameter reduction process (FIG. 9(*b*)), cutting the produced nanowire array to a prescribed length (FIG. 9(*c*)), and forming a thermoelectric material by bundling a plurality of cut wires and subjecting the wires to annealing treatment (FIG. 9(*d*) and (*e*)).

Referring to FIG. 9(*a*), a base material is formed by concentrically providing second semiconductor member 7 around columnar first semiconductor member 6. First semiconductor member 6 is composed, for example, of silicon (Si) and second semiconductor member 7 is composed, for example, of silicon oxide ($SiO_2$). Wire 5 is formed by heating and melting this columnar base material and wire-drawing the base material. Wire 5 subjected to the diameter reduction process is constructed such that first semiconductor member 6 to be a quantum wire and second semiconductor member 7 to be an energy barrier layer are concentrically arranged. A cylindrical heating furnace 100 arranged outside the base material is used for heating and melting the base material. A speed of wiredrawing by a roller 110 is controlled such that an outer diameter of the wiredrawn base material is maintained at a constant value. Wire 5 fed from roller 110 is wound around a winding drum 20.

Referring to FIG. 9(*b*), a bundle of a plurality of wires 5 each wound around winding drum 120 is subjected to the diameter reduction process. Specifically, an assembly of wires 5 is heated and molten by heating furnace 100 and thereafter wiredrawn by roller 110. A nanowire array 5A is produced by repeating one or more times, treatment for bundling a plurality of assemblies of wires 5 subjected to the diameter reduction process and subjecting a bundle of the plurality of assemblies to the diameter reduction process. In produced nanowire array 5A, first semiconductor member 6 may be discontinuous in the longitudinal direction of nanowire array 5A.

In FIG. 9(*c*), nanowire array 5A is cut to a prescribed length L so as to divide the nanowire array into a plurality of round rod materials 5B. In FIG. 9(*d*), a plurality of round rod materials 5B are arranged in a direction perpendicular to the longitudinal direction. The plurality of round rod materials 5B are secured by subjecting the plurality of round rod materials 5B to annealing treatment of firing at a temperature at which second semiconductor member 7 (for example, $SiO_2$) is softened (for example, around 800° C.).

Thermoelectric material 10 as shown in FIG. 9(*e*) is formed by polishing surfaces of the plurality of secured round rod materials 5B and forming the round rod materials in a parallelepiped shape. Thermoelectric material 10 has a structure in which a plurality of wires 5 having the quantum wire structure are arranged in the direction perpendicular to the longitudinal direction (corresponding to the direction of carrier transport) substantially as shown in FIG. 8. Namely, first semiconductor member 6 to be the quantum wire has a wire diameter not greater than 5 nm and a distance between adjacent first semiconductor members 6 in the direction of carrier transport is not greater than 3 nm.

As set forth above, according to the first embodiment of this invention, in the thermoelectric material having the quantum wire structure, by matching the direction of quantization with the direction of carrier transport in the thermoelectric material, the quantum effect can be exhibited and thermoelectric characteristics can be improved.

By setting a wire diameter of the quantum wire to 5 nm or smaller and setting a thickness of the energy barrier layer to 1.5 nm or smaller in the thermoelectric material, the quantum effect can effectively be achieved and good thermoelectric characteristics can be realized.

<Second Embodiment>

1. Construction of Thermoelectric Material

Quantum dots refer to nanoparticles of a semiconductor of which particle size is as small as approximately several nanometers. When nanoparticles are three-dimensionally surrounded by a sufficiently thick and high energy barrier layer, they become quantum dots. In a case of ideal quantum dots, a carrier velocity v=0 is achieved in the expression (4), and hence conductivity σ=0 is achieved, which is not suited for a thermoelectric material.

Figure 10:
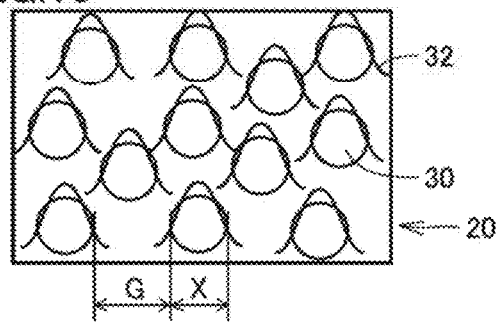
FIG. 10 is a schematic diagram showing a construction of a thermoelectric material according to a second embodiment of this invention.

In this embodiment, wave functions of carriers are combined between quantum dots by decreasing an interval between quantum dots (nanoparticles). A quantum dot structure is a structure in which a state that an electron state around a valence band and a conduction band is quantized in a three-dimensional direction and an energy level is discretized is obtained. The quantum dot structure can have discrete sub band structures not only in the z direction but also in the x direction and the y direction, and can achieve effective energy conversion. With this quantum effect of the quantum dots, transport of carriers between the quantum dots is allowed. FIG. 10 is a schematic diagram showing a construction of a thermoelectric material 20 according to a second embodiment of this invention. In the description below, a quantum dot structure shown in FIG. 10 is also referred to as a "quantum network (net) structure."

Referring to FIG. 10, in the quantum net structure, quantum dots (nanoparticles) 30 implement a "first semiconductor member" in the present invention. A base material in which quantum dots 30 are arranged as being distributed forms an energy barrier layer and implements a "second semiconductor member" in the present invention. In thermoelectric material 20, quantum dots 30 and the base material are alternately arranged in the direction of carrier transport. Since the direction of quantization can thus match with the direction of carrier transport in thermoelectric material 20, the quantum effect can be exhibited.

Figure 11:
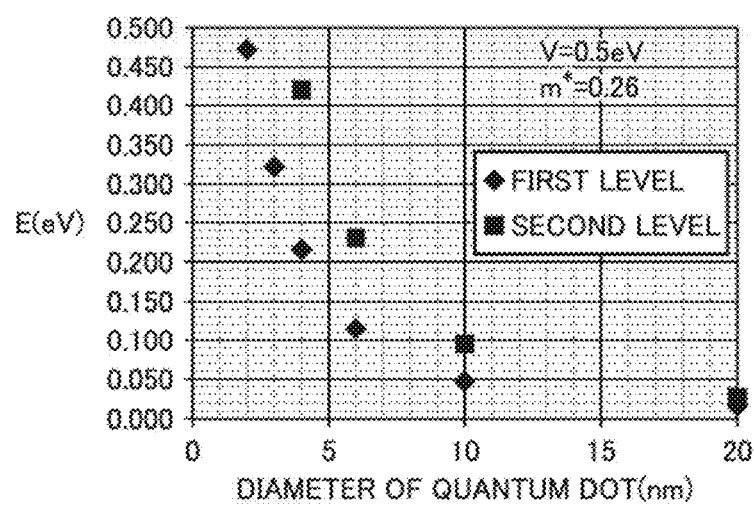
FIG. 11 is a diagram showing relation between a particle size of quantum dots and a quantum level.
Figure 12:
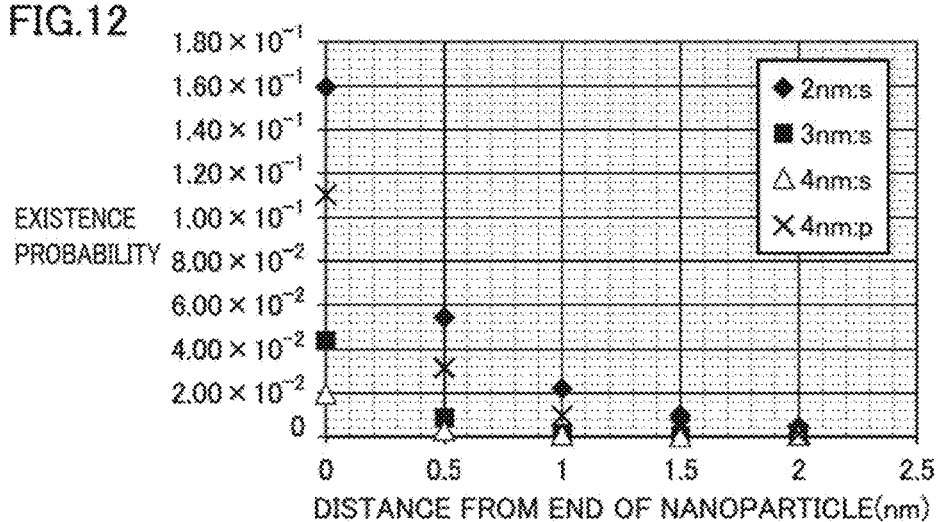
FIG. 12 is a diagram showing relation between a distance from an end surface of a quantum dot and an existence probability of carriers.

In quantum dots (nanoparticles) 30, a state that an electron state in a valence band and a conduction band is quantized in a three-dimensional direction and an energy level is discretized can be obtained. A particle size X of quantum dot 30 is preferably a particle size appropriate for producing a sufficient quantum effect. An interparticle distance G between quantum dots 30 (corresponding to a shortest distance from one end surface to the other end surface between adjacent quantum dots 30) is preferably set to an interval appropriate for combination of wave functions 32 of carriers. The present inventor has studied particle size X of and interparticle distance G between quantum dots 30 appropriate for quantization, by solving the Schrodinger equation for three-dimensional finite potential quantum dots. FIGS. 11 and 12 show results of the studies.

FIG. 11 is a diagram showing relation between a particle size of a quantum dot and a quantum level. The ordinate in FIG. 11 represents quantum levels of a quantum dot (a first level and a second level) and the abscissa represents a particle size of the quantum dot. It can be seen with reference to FIG. 11 that a quantum level is formed when the quantum dot has a particle size smaller than 20 nm. It is thus expected that the quantum effect is obtained when the quantum dot has a particle size smaller than 20 nm. In particular when the quantum dot has a particle size not greater than 5 nm, the quantum effect is noticeable, which is preferred.

FIG. 12 is a diagram showing relation between a distance from an end surface of a quantum dot and an existence probability of carriers. The ordinate in FIG. 12 represents an existence probability of carriers and the abscissa represents a distance from an end surface of a quantum dot. In FIG. 12, an existence probability of carriers from an end surface of a quantum dot was calculated by solving the Schrodinger equation for each of four types of quantum dots different in particle size from one another (particle sizes of 2 nm, 3 nm, and 4 nm on an s orbital and a particle size of 4 nm on a p orbital).

Referring to FIG. 12, the existence probability of carriers is highest at the end surface of the quantum dot and lowers as a distance from the end surface is greater. An existence probability of each of the four types of the quantum dots is substantially 0 when a distance from the end surface reaches 2 nm. It can thus be seen that carriers are present within a range where a distance from the end surface of the quantum dot is not greater than 1.5 nm. Therefore, it is expected that, by setting an interval between an end surface of one quantum dot and an end surface of the other quantum dot between two proximate quantum dots to 3 nm (=1.5 nm×2) or smaller, wave functions can be combined between the two quantum dots.

As set forth above, in the quantum net structure according to the second embodiment, preferably, a quantum dot has a particle size not greater than 5 nm and an interparticle distance between quantum dots is not greater than 3 nm. In the thermoelectric material having such a quantum net structure, a particle size of the quantum dot corresponds to a width of the quantum dot in the direction of carrier transport, and an interval between quantum dots corresponds to a distance between the quantum dots in the direction of carrier transport. Setting thickness w of energy barrier layer 7 in the quantum wire structure shown in FIGS. 8 to 1.5 nm or smaller in the thermoelectric material according to the first embodiment relies on this interparticle distance between quantum dots.

2. Method for Manufacturing Thermoelectric Material

A method for manufacturing a thermoelectric material according to the second embodiment of this invention will now be described.

A thermoelectric material having a quantum net structure is manufactured by forming nanoparticles containing a base material element and a different element different from the base material element, in a base material composed of a semiconductor material composed of the base material element. The method for manufacturing nanoparticles includes a stacking step of alternately stacking a first layer containing the different element and a second layer not containing the different element and an annealing step of forming nanoparticles in the base material by subjecting the stack of the first layer and the second layer to annealing treatment.

Examples of a semiconductor material forming the base material include silicon germanium (for example, SiGe), a bismuth tellurium base (for example, $Bi_2Te_3$, $Bi_2Sb_3$, and $Pb_2Te_3$), a magnesium silicide base (for example, $MgSi_2$), a strontium titanate base (for example, $SrTiO_3$, $LaSrTiO_3$, $LaSrTiO_3$:NiMO, $LaSrCuO_4$, and $NdCeCuO_4$), an iron silicide base (for example, $FeSi_2$, $FeMnSi_2$, and $FeCoSi_2$), a half-Whistler base (for example, ZrNiSn, TiZrNiSn, and (Ti, Zr, Hf)Ni(Sn, Sb)), a skutterudite base (for example, La—Fe—Sb and Ce—Co—Sb), a zinc antimony base (for example, ZnSb, $Zn_4Sb_3$, and $Zn_3Sb_2$), a boron based compound (for example, $CaB_6$, $SrB_6$, and $BaB_6$), a Co based oxide (for example, $NaCoO_2$, $NaCo_2O_4$, $Ca_2CoO_3$, $Ca_3Co_4O_9$, and $Sr_2(BiPb)_2O_4$), tin oxide (for example, $SnO_2$), lead oxide (for example, ZnO), indium oxide (for example, $In_2O_3$), and a nitride semiconductor (for example, GaN, InGaN, AlN, InAlN, and InAlGaN).

When the base material is composed of silicon germanium, the base material element is Si and Ge and examples of the different element include gold (Au), copper (Cu), boron (B), aluminum (Al), and phosphorus (P). When the base material is composed of a bismuth tellurium base, the base material element is Bi and Te or Pb and examples of the different element include Au, Cu, B, and Al. When the base material is composed of a magnesium silicide base, the base material element is Mg and Si and examples of the different element include Au, Cu, B, Al, and P. When the base material is composed of a nitride semiconductor, the base material element contains at least Ga and N and examples of the different element include In (indium) and Al.

In the stacking step, each layer can be stacked with molecular beam epitaxy (MBE), electron beam (EB), sputtering, metal-organic vapor phase epitaxy (MOVPE), or vapor deposition. A concentration of atoms of the different element in the first layer is preferably from 0.5 to 50 atomic %. The first layer may be formed from a single layer or multiple layers. In the stacking step, the base material element is totally contained in at least one of the first layer and the second layer. For example, when the base material is composed of silicon germanium, Ge is contained as the base material element in the first layer and Si is contained as the base material element in the second layer. In the stacking step, the first layer and the second layer can alternately be stacked, and for example, each of the first layer and the second layer can be stacked 1 to 1000 times. The number of times of stacking the first layer substantially matches with the number of formed nanoparticles in a direction of thickness.

In the annealing step, the stack of the first layer and the second layer is subjected to annealing treatment so that nanoparticles are formed in the base material. The annealing treatment here refers to treatment for cooling after heating until atoms in the first layer are diffused. Therefore, a temperature and a time period for annealing treatment are different depending on a material for the first layer. By controlling a temperature and a time period for annealing treatment and a rate of temperature increase in annealing treatment, whether or not nanoparticles are formed and a particle size of formed nanoparticles can be adjusted.

The stacking step and the annealing step may be performed independently of each other or simultaneously with each other. In performing the steps independently, the annealing step is performed after the stacking step of alternately stacking the first layer and the second layer is completed. In performing the steps simultaneously, the stacking step is performed under conditions for the annealing treatment so that the annealing treatment is performed simultaneously in the stacking step.

Figure 13:
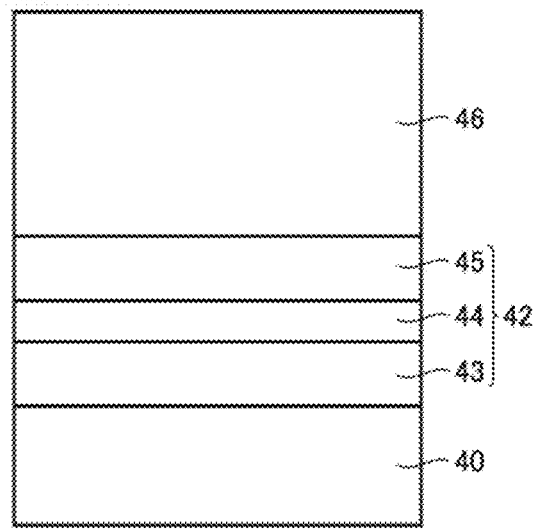
FIG. 13 is a cross-sectional view schematically showing a stack in a state after a stacking step which was performed once and before annealing treatment, in the second embodiment.

FIG. 13 is a cross-sectional view schematically showing a stack in a state after the stacking step which was performed once and before annealing treatment. In this embodiment, silicon germanium is adopted as the base material and Au is adopted as the different element.

In the stacking step, initially, a sapphire substrate 40 is prepared, and a first layer 42 constituted of an amorphous Ge (a-Ge) layer 43/an Au layer 44/an amorphous Ge (a-Ge) layer 45 is formed by successively depositing Ge, Au, and Ge with MBE. Thereafter, a second layer 46 formed from an amorphous Si (a-Si) layer is formed by depositing Si. Each source material of Ge, Au, and Si is heated with electron beam in a cell to thereby emit molecular beams. A stack is formed by repeating stacking of first layer 42 and second layer 46 60 times. The stack has a thickness of approximately 300 nm. In this embodiment, since deposition is easy, the a-Ge layer and the Au layer are separate in the first layer. So long as Ge and Au are included in the first layer, however, limitation to such a deposition method is not intended.

Thereafter, quantum dots (nanoparticles) are formed by subjecting the stack to annealing treatment. Through annealing treatment, nanoparticles of SiGe containing Au are formed in the base material composed of Si and Ge. A mechanism of formation of nanoparticles as such in this embodiment is understood as follows. Initially, AuGe lower in eutectic point than AuSi is activated in first layer 42, thereafter Si contained in second layer 46 is taken in, and thus nanoparticles of SiGe containing Au are formed. The base material composed of Si and Ge around nanoparticles of SiGe is composed of amorphous SiGe, amorphous Ge, or amorphous Si.

Though a temperature for annealing treatment can be selected as appropriate from a range of 200 to 800° C., in order to obtain nanoparticles having a particle size not greater than 5 nm, a temperature for annealing treatment is preferably from 300° C. to 700° C. A time period for annealing treatment in the annealing step can be set, for example, to 1 to 120 minutes. When a temperature for annealing treatment is set to 700° C., a time period for annealing treatment is preferably set to 15 minutes.

Here, particle size X of formed nanoparticles can be adjusted by a thickness $T_1$ of first layer 42, a thickness $T_2$ of second layer 46, a concentration of atoms of the different element contained in first layer 42, or a condition for annealing treatment for the stack. In this embodiment, particle size X of nanoparticles is adjusted by thickness $T_1$ of first layer 42.

Figure 14:
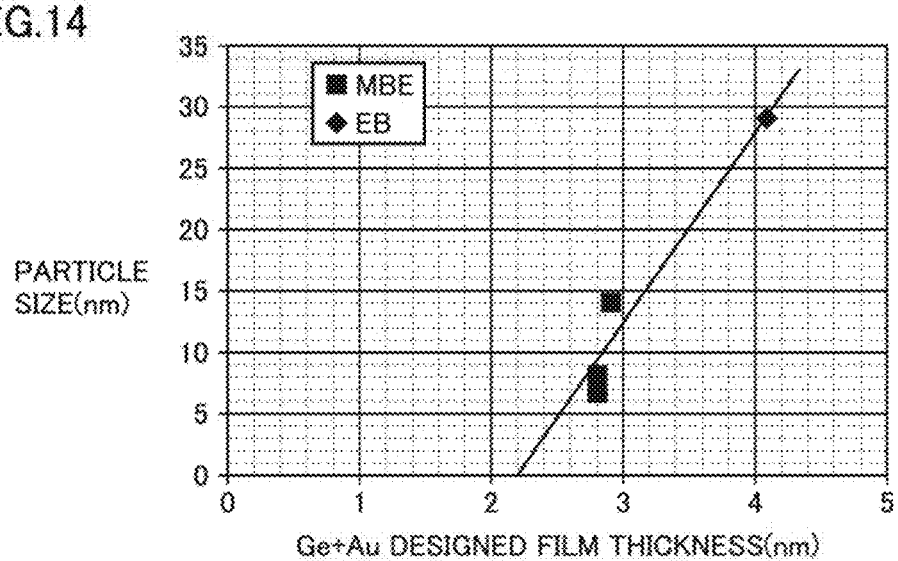
FIG. 14 is a diagram showing relation between a designed film thickness of a first layer in the stacking step and a particle size of nanoparticles in a manufactured sample.

FIG. 14 is a diagram showing relation between a designed film thickness of the first layer in the stacking step and a particle size of nanoparticles in a manufactured sample. Particle size X of nanoparticles was calculated with the Scherrer's equation based on a result of measurement in X-ray diffraction (XRD). FIG. 14 shows designed film thickness $T_1$ of first layer 42 and data on particle size X for a plurality of samples manufactured with the manufacturing method according to the present embodiment. Some of the plurality of samples were obtained by depositing first layer 42 and second layer 46 with molecular beam epitaxy (MBE) and remaining samples were obtained by depositing first layer 42 and second layer 46 with electron beam (EB). Relation shown in an expression (6) was derived from the results shown in FIG. 14, with a least square method.

$$X=(15\pm3)T_1-(33\pm11) \tag{6}$$

When a desired particle size of nanoparticles is denoted as $X_d$, thickness $T_1$ of first layer 42 in the stacking step is preferably determined to satisfy the expression (6). By adopting thickness $T_1$ of first layer 42 thus determined, nanoparticles of which average particle size $X_m$ satisfies the expression (6) can be formed through the annealing step. The particle size of nanoparticles herein refers to a longer diameter of particles measured in an image obtained with an electron microscope (a two-dimensional plane projection image). The average particle size refers to an arithmetic mean of particle sizes of a sufficient number of particles. In the present application, an arithmetic mean of particle sizes of 22 particles was calculated as the average particle size.

Figure 15:
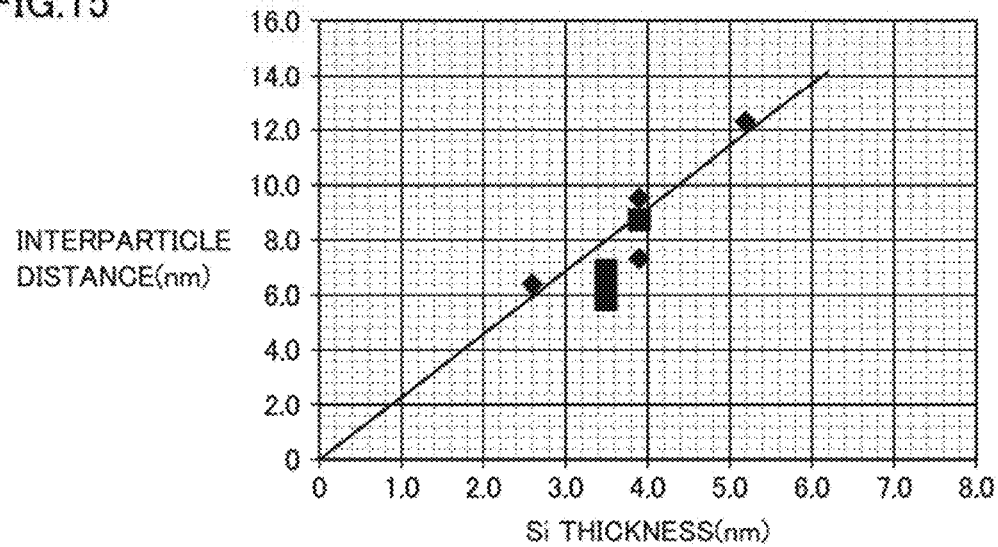
FIG. 15 is a diagram showing a film thickness of a second layer and data on an interparticle distance in a plurality of samples.

Interparticle distance G between formed nanoparticles can be adjusted by thickness $T_2$ of second layer 46. FIG. 15 is a diagram showing relation between film thickness $T_2$ of second layer 46 in the stacking step and interparticle distance G between nanoparticles in a sample. Average interparticle distance G was calculated as interparticle distance G between nanoparticles, by conducting actual measurement in a high-resolution transmission electron microscopy (TEM) image obtained with an electron microscope (a name of an apparatus: JEM-2100F manufactured by JEOL Ltd.) after slicing to approximately 100 nm with focused ion beam (FIB) in a direction of stack and an FFT image resulting from processing for emphasizing a periodic structure of nanocrystals through fast Fourier transform (FFT). FIG. 15 is a diagram showing film thickness $T_2$ of second layer 46 and data on interparticle distance G for a plurality of samples manufactured with the manufacturing method according to the present embodiment. Relation shown in an expression (7) was derived from results shown in FIG. 15, with a least square method.

$$G=(2.3\pm0.9)T_2+(0.0\pm3) \tag{7}$$

Therefore, with a desired interparticle distance between nanoparticles being denoted as $G_d$, thickness $T_2$ of second layer 46 is preferably determined to satisfy the expression (7) in the stacking step. By adopting thickness $T_2$ of second layer 46 thus determined, nanoparticles of which average interparticle distance $G_m$ satisfies the expression (7) can be formed through the annealing step. The interparticle distance between nanoparticles herein refers to a shortest distance from an end to an end of a particle measured in an image obtained with an electron microscope (a two-dimensional plane projection image). The average interparticle distance refers to an arithmetic mean of interparticle distances of a sufficient number of particles. In the present application, an arithmetic mean of interparticle distances of 22 particles was calculated as an average interparticle distance.

As described above, in a quantum net structure according to the second embodiment, average particle size $X_m$ of quantum dots (nanoparticles) is preferably not greater than 5 nm and average interparticle distance $G_m$ is preferably not greater than 3 nm. In order to obtain nanoparticles having such a particle size and an interparticle distance, thickness $T_1$ of first layer 42 is preferably not greater than 2.5 nm and thickness $T_2$ of second layer 46 is preferably not greater than 1.4 nm.

3. Evaluation of Thermoelectric Material

Seebeck coefficient S and conductivity σ were measured for a plurality of samples and thermoelectric characteristics when a sample is used as a thermoelectric material were evaluated. Some of the plurality of samples were obtained by depositing the first layer and the second layer with molecular beam epitaxy (MBE) and remaining samples were obtained by depositing the first layer and the second layer with electron beam (EB).

(Measurement of Seebeck Coefficient and Conductivity)

Seebeck coefficient S of the plurality of samples was measured with a thermoelectric characteristic evaluation apparatus (a name of an apparatus: ZEM3 manufactured by ULVAC, Inc.). Conductivity σ of the plurality of samples was measured with a conductivity measurement apparatus (a name of an apparatus: ZEM3 manufactured by ULVAC, Inc.).

Figure 16:
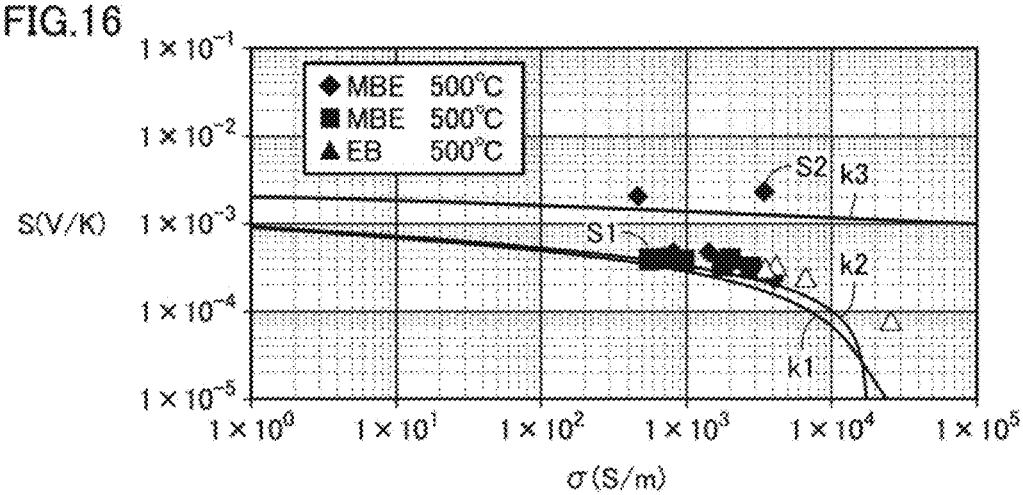
FIG. 16 is a diagram showing a result of measurement of a conductivity and a Seebeck coefficient of a plurality of samples.

FIG. 16 is a diagram showing a result of measurement of conductivity σ and Seebeck coefficient S of the plurality of samples. In FIG. 16, the ordinate represents Seebeck coefficient S and the abscissa represents conductivity σ. In FIG. 16, theoretic lines representing thermoelectric characteristics of the bulk structure, the quantum well structure, and the quantum wire structure shown in FIG. 5 are also shown for comparison. In the figure, k1 represents relation between Seebeck coefficient S and conductivity σ of the bulk structure, k2 represents relation between Seebeck coefficient S and conductivity σ of the quantum well structure, and k3 represents relation between Seebeck coefficient S and conductivity σ of the quantum wire structure.

Referring to FIG. 16, while most of the plurality of samples exhibit thermoelectric characteristics equivalent to those of the bulk structure, some samples exhibit high thermoelectric characteristics equivalent to those of the quantum wire structure.

Then, a sample S1 exhibiting thermoelectric characteristics equivalent to those of the bulk structure and a sample S2 exhibiting good thermoelectric characteristics were extracted from the plurality of samples, and cross-sections of these two samples S1 and S2 were observed with a transmission electron microscope (TEM). TEM observation was conducted after the stack subjected to the annealing step was sliced with FIB in the direction of stack.

Figure 17:
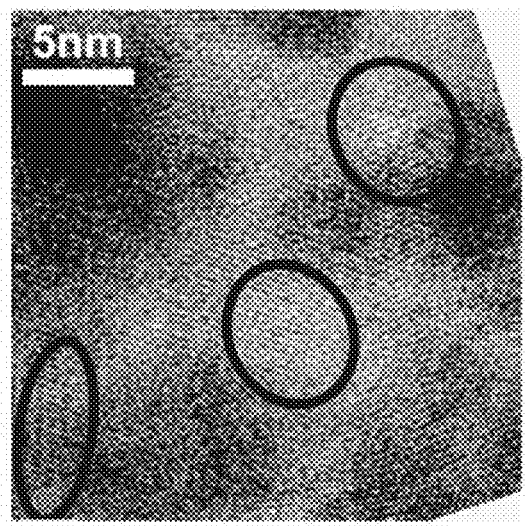
FIG. 17 is a diagram showing a high-resolution TEM image of a sample S1.
Figure 18:
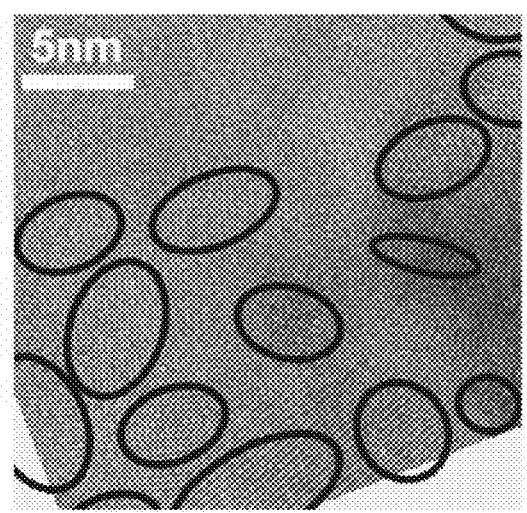
FIG. 18 is a diagram showing a high-resolution TEM image of a sample S2.

FIG. 17 shows a high-resolution TEM image of sample S1. FIG. 18 shows a high-resolution TEM image of sample S2. In FIGS. 17 and 18, a region surrounded with a solid line is a region estimated to be crystallized. When a grain size of crystal grains was actually measured in the high-resolution TEM image of sample S1 shown in FIG. 17, the crystal grains had a grain size from 2 to 5 nm. When an interval between crystal grains was actually measured, it was from 5 to 8 nm.

When a grain size of crystal grains was actually measured in the high-resolution TEM image of sample S2 shown in FIG. 18, the crystal grains had a grain size from 2 to 5 nm. When an interval between crystal grains was actually measured, it was from 1 to 3 nm. A crystal structure of this sample S2 is close to a crystal structure ideal for nanoparticles to exhibit the quantum effect. Namely, it is estimated that the quantum net structure according to the second embodiment of this invention has been realized in sample S2.

(Calculation of Ratio of Crystallization)

A ratio of crystallization was calculated based on Raman scattering measurement of a plurality of samples manufactured with the manufacturing method according to the second embodiment. The ratio of crystallization refers to a ratio (Ic/Ia) of a peak intensity (Ic) of single crystal SiGe to a peak intensity (Ia) of amorphous SiGe, amorphous Ge, and amorphous Si found from spectra in Raman spectrometry.

Figure 19:
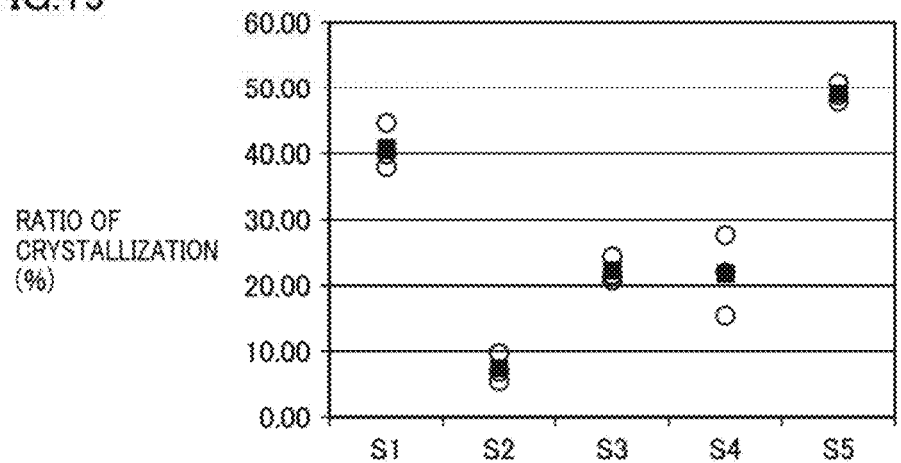
FIG. 19 is a diagram showing a ratio of crystallization calculated from Raman scattering measurement.

FIG. 19 is a diagram showing a ratio of crystallization calculated from Raman scattering measurement of five samples. The ratio of crystallization shown in FIG. 19 was obtained by calculating a ratio of crystallization at a plurality of measurement locations for each of five samples S1 to S5 and calculating an average value thereof. A black square in the figure represents an average ratio of crystallization for each sample.

Referring to FIG. 19, sample S1 corresponds to sample S1 shown in FIGS. 16 and 17 and sample S5 corresponds to sample S2 shown in FIGS. 16 and 18. Remaining samples S2 to S4 are poorer in thermoelectric characteristics than samples S1 and S5. Sample S1 exhibiting thermoelectric characteristics equivalent to those of the bulk structure was 41% in ratio of crystallization, whereas sample S5 exhibiting good thermoelectric characteristics was 49% in ratio of crystallization. It seems based on this result of evaluation that the ratio of crystallization should be 45% or higher in order to realize good thermoelectric characteristics.

(FFT Analysis Result)

Sample S2 was subjected to processing for emphasizing a periodic structure of nanocrystals by subjecting the high-resolution TEM image obtained with an electron microscope (a name of an apparatus: JEM-2100F manufactured by JEOL Ltd.) after slicing to approximately 100 nm with FIB in the direction of stack to FFT. TEM observation was conducted under a condition of an acceleration voltage of 200 kV. DigitalMicrograph® manufactured by Gatan, Inc. was employed for FFT.

Figure 20:
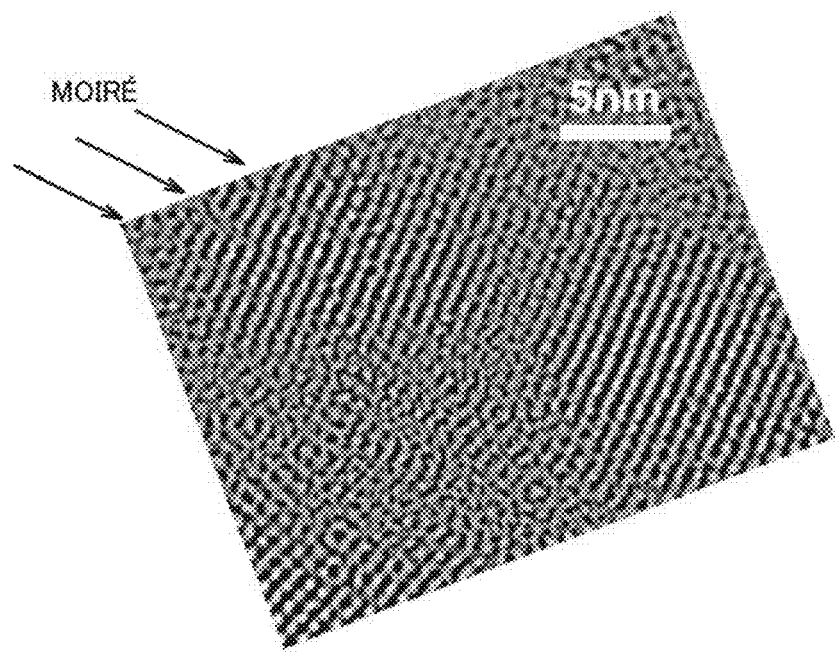
FIG. 20 is a diagram showing an FFT image of sample S2.

FIG. 20 shows an FFT image of sample S2. In the FFT image shown in FIG. 20, moiréfringes extending in a direction shown with an arrow in the figure appear, which suggests that there are a plurality of nanoparticles of which crystallographic axes are aligned in a direction of passage of electron beams. It can thus be seen that there are a large number of nanoparticles in sample S2.

As set forth above, according to the second embodiment of this invention, in the thermoelectric material having the quantum net structure, the quantum effect can be expressed and thermoelectric characteristics can be improved by decreasing an interparticle distance between quantum dots (nanoparticles) and combining wave functions of carriers between the quantum dots.

Furthermore, the quantum effect can effectively be obtained and good thermoelectric characteristics can be realized by setting a particle size of nanoparticles in the thermoelectric material to 5 nm or smaller and an interparticle distance to 3 nm or smaller.

<Third Embodiment>

1. Construction of Thermoelectric Material

A thermoelectric material according to a third embodiment of this invention has the quantum net structure (FIG. 10), and is manufactured by forming nanoparticles containing a base material element and a different element different from the base material element in a base material made of a semiconductor material composed of the base material element. The thermoelectric material according to the third embodiment is different from the thermoelectric material according to the second embodiment in further including a support portion supporting a material containing nanoparticles. The thermoelectric material according to the third embodiment has such a construction that the different element is diffused in the support portion. As will be described below in detail, such a construction is obtained by employing a substrate of which at least uppermost portion is formed of a material capable of forming a solid solution of the different element in the method for manufacturing a thermoelectric material.

2. Method for Manufacturing Thermoelectric Material

A method for manufacturing a thermoelectric material according to the third embodiment of this invention includes a stacking step of alternately stacking a first layer containing a different element and a second layer not containing the different element and an annealing step of forming nanoparticles in a base material by subjecting a stack of the first layer and the second layer to annealing treatment.

In the third embodiment, the stacking step is a step of alternately stacking the first layer and the second layer on a substrate body. Such a substrate body is preferably formed in such a manner that an uppermost portion thereof in contact with the first layer or the second layer is formed of a material capable of forming a solid solution of the different element. With such a construction, in diffusion of the different element through annealing treatment, the different element can diffuse also in the substrate body and precipitation of the different element as being concentrated in a specific portion, in particular, in a portion of the first layer in contact with the substrate body, can be prevented. When the different element is precipitated as being concentrated in a specific portion, such a specific portion may form a leak path, which hence may be a cause for lowering in thermoelectric characteristics when the stack containing nanoparticles manufactured with the manufacturing method according to the embodiment of the present invention is used as the thermoelectric material. Lowering in thermoelectric characteristics due to such a leak path tends to be noticeable when a temperature difference caused in the thermoelectric material is great, for example, when a temperature difference is more than 1 K. Therefore, even a substrate body not having an uppermost portion can obtain sufficient thermoelectric characteristics. In particular when a temperature difference caused in the thermoelectric material is small, for example, not more than 1 K, sufficient thermoelectric characteristics can be obtained even by a substrate body not having an uppermost portion.

A material forming the uppermost portion is not limited so long as a material can form a solid solution of a different element contained in the first layer under a treatment condition for the annealing step, and examples of such a material include Si, a semiconductor, glass, ceramics, and an organic substance such as poly(3,4-ethylenedioxythiophene) (PEDOT). Examples of glass include amorphous glass and porous glass.

A material low in rate of diffusion of a different element is more preferred as a material forming the uppermost portion, because a material lower in rate of diffusion of a different element facilitates control of diffusion of the different element in the uppermost portion. For example, when Au is employed as a different element, one example of a material which can form a solid solution of Au includes Si and Ge. Of these, Si is lower in rate of diffusion of Au, and hence Si is more preferably used to form the uppermost portion. A rate of diffusion of a different element in a material is expected to correlate with affinity between a material and the different element and with a melting point of a material containing the different element.

The substrate body may be a stack of the uppermost portion and other layers or a single-layered body consisting of the uppermost portion. In a case of a stack, for example, a stack in which the uppermost portion is formed on a substrate can be employed. In the substrate body, the uppermost portion forms a support portion supporting a material containing nanoparticles. Though a thickness of the uppermost portion is not limited so long as precipitation of a different element as being concentrated in a specific portion of the first layer can be prevented, the thickness is preferably not smaller than 5 nm and further preferably not smaller than 15 nm. With the thickness not smaller than 5 nm, a different element which diffuses under a treatment condition in the annealing step can sufficiently be contained. Though an upper limit value is not particularly limited, it can be, for example, not greater than 300 nm from a point of view of cost.

A manufacturing method in a case that silicon germanium is employed as a base material and Au is employed as a different element will be described below as one example of the manufacturing method according to the third embodiment. The manufacturing method according to the third embodiment is different from the manufacturing method according to the second embodiment only in using a substrate body 48 instead of sapphire substrate 40.

Figure 21:
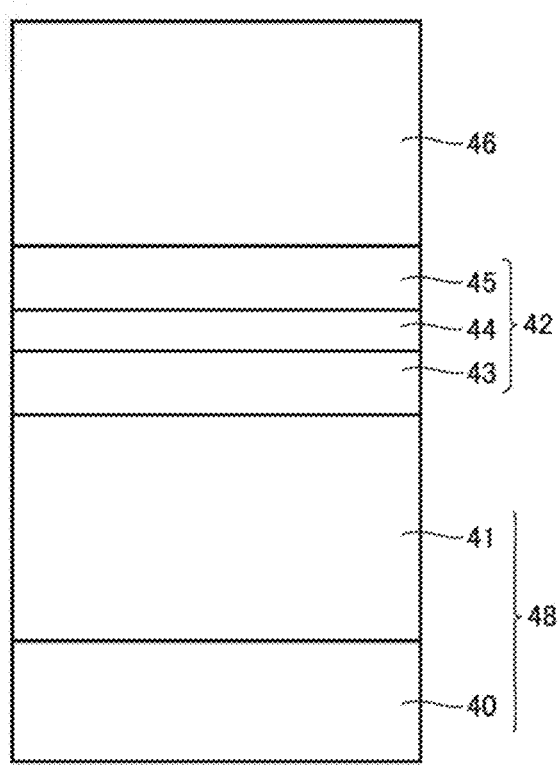
FIG. 21 is a cross-sectional view schematically showing a stack in a state after the stacking step which was performed once and before annealing treatment in a third embodiment.

FIG. 21 is a cross-sectional view schematically showing a stack in a state after the stacking step which was performed once and before annealing treatment. Referring to FIG. 21, substrate body 48 is constituted of sapphire substrate 40 and an uppermost layer (uppermost portion) 41 formed from an amorphous Si (a-Si) layer. In substrate body 48, initially, sapphire substrate 40 is prepared and uppermost layer 41 is formed thereon by depositing Si with MBE or EB. Since other steps are the same as in the second embodiment, description thereof will not be provided. In a stack containing nanoparticles which is manufactured according to this embodiment, Au is diffused in uppermost layer 41

3. Example

[Experiments for Comparing Effect Depending on Presence/Absence of Uppermost Layer in Substrate Body]

(Samples S6 to S8)

Nanoparticles were formed with the manufacturing method according to the first embodiment or the third embodiment. Specifically, initially, a substrate body was prepared. A substrate body consisting of a sapphire substrate and a substrate body provided with an uppermost layer composed of amorphous silicon (a-Si) on a sapphire substrate were prepared as substrate bodies. Then, the first layer constituted of an a-Ge layer/an Au layer/an a-Ge layer was deposited on the substrate body to respective layer thicknesses of 1.1 nm/0.2 nm/1.1 nm through the stacking step, and the second layer formed from an a-Si layer was deposited to a thickness of 1.0 nm by thereafter depositing Si. A concentration of Au in the first layer was set to 3.3 to 4.7 atomic %. The step of stacking the first layer and the second layer was repeated 40 times. Thereafter, nanoparticles were formed by performing the annealing step by subjecting the stack to annealing treatment as being left for 15 minutes in an environment at 500° C. in a rapid thermal anneal (RTA) furnace of a nitrogen atmosphere.

As shown in Table 1 below, sample S6 includes a substrate body consisting of the sapphire substrate, sample S7 includes a substrate body in which an uppermost layer having a thickness of 15 nm is provided on the sapphire substrate, and sample S8 includes a substrate body in which an uppermost layer having a thickness of 30 nm is provided on the sapphire substrate.

TABLE 1

| | Presence/Absence of Uppermost Layer (a-Si Layer)/Thickness | Concentration of Au (Atomic %) |
| --- | --- | --- |
| Sample S6 | Absent | 4.7 |
| Sample S7 | Present/15 nm | 3.3 |
| Sample S8 | Present/30 nm | 3.5 |

Figure 22:
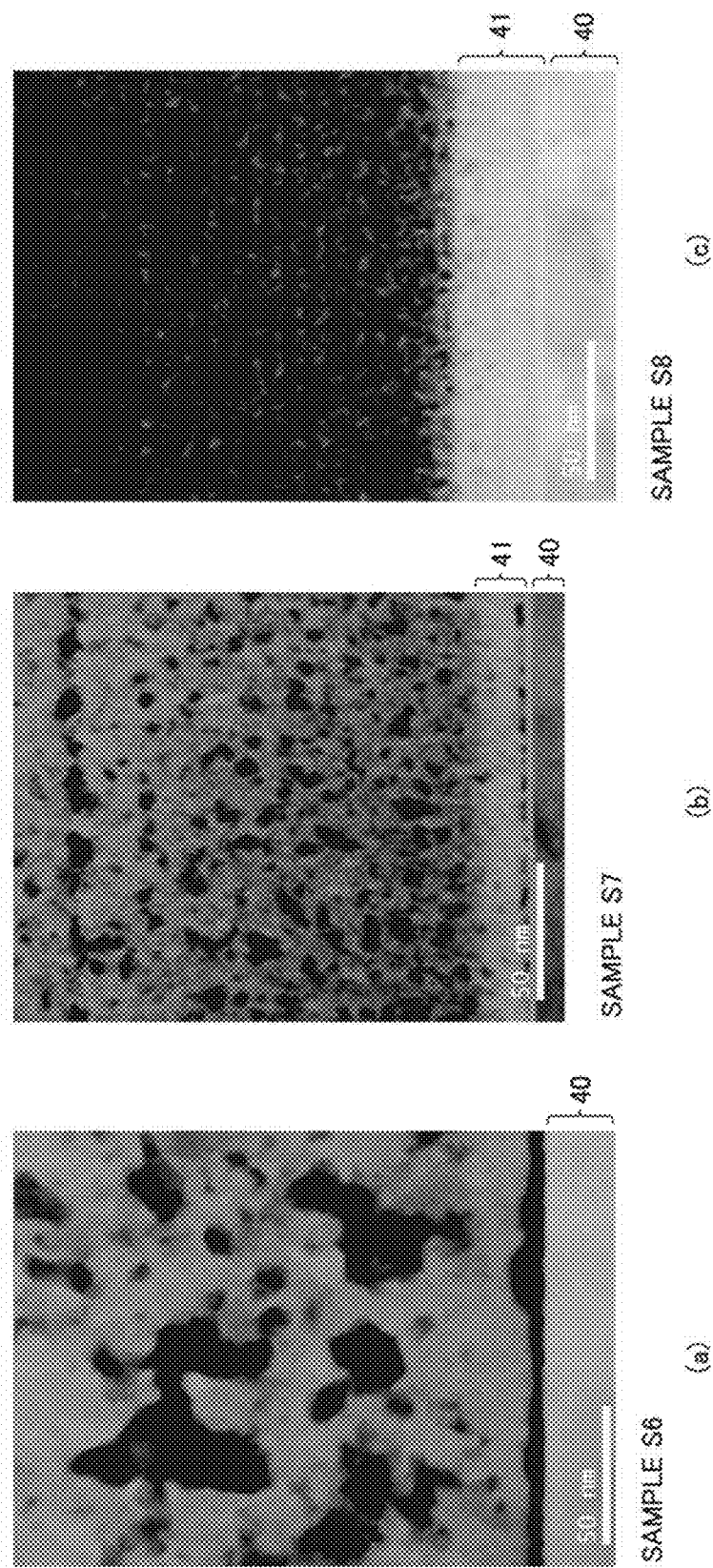
FIG. 22 is a diagram showing a bright-field STEM image of each of (a) a sample S6, (b) a sample S7, and (c) a sample S8.

Bright-field scanning transmission electron microscopy (STEM) images of stacks according to samples S6 to S8 fabricated as above were obtained with an electron microscope (a name of an apparatus: JEM-2100F manufactured by JEOL Ltd.). FIG. 22(a), (b), and(c) shows bright-field STEM images of a portion including sapphire substrate 40 for samples S6, S7, and S8. In FIG. 22(a), a black portion in a layer on sapphire substrate 40 represents Au. Au represented by the black portion in the STEM image was confirmed by obtaining energy dispersive X-ray spectrometry (EDX) of the STEM image. As shown in FIG. 22(a), it was observed that Au precipitated as being concentrated in a portion of the first layer in contact with sapphire substrate 40 when no uppermost layer was provided on sapphire substrate 40. In FIG. 22(b) and(c), it was confirmed that Au diffused in uppermost layer 41 on sapphire substrate 40 and there was no portion where Au precipitated as being concentrated around a boundary of uppermost layer 41 It was confirmed that, in sample S7 in which uppermost layer 41 had a thickness of 15 nm as well, Au diffused in uppermost layer 41 as shown in FIG. 22(b) and precipitation of Au as being concentrated in a specific portion could be prevented. Therefore, it could be expected that Au was diffused in uppermost layer 41 and precipitation of Au as being concentrated in a specific portion can be prevented even when uppermost layer 41 has a thickness of 5 nm which is ⅓ of 15 nm in sample S4.

(Measurement of Thermoelectromotive Force)

Figure 23:
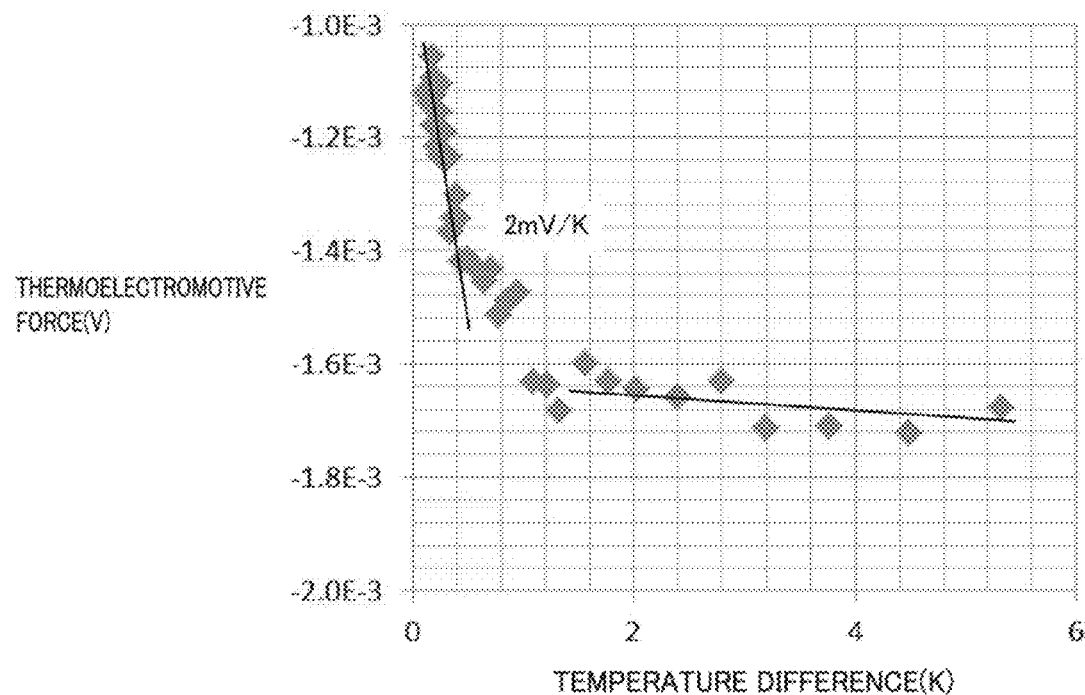
FIG. 23 is a diagram showing a result of measurement of thermoelectromotive force of sample S6.
Figure 24:
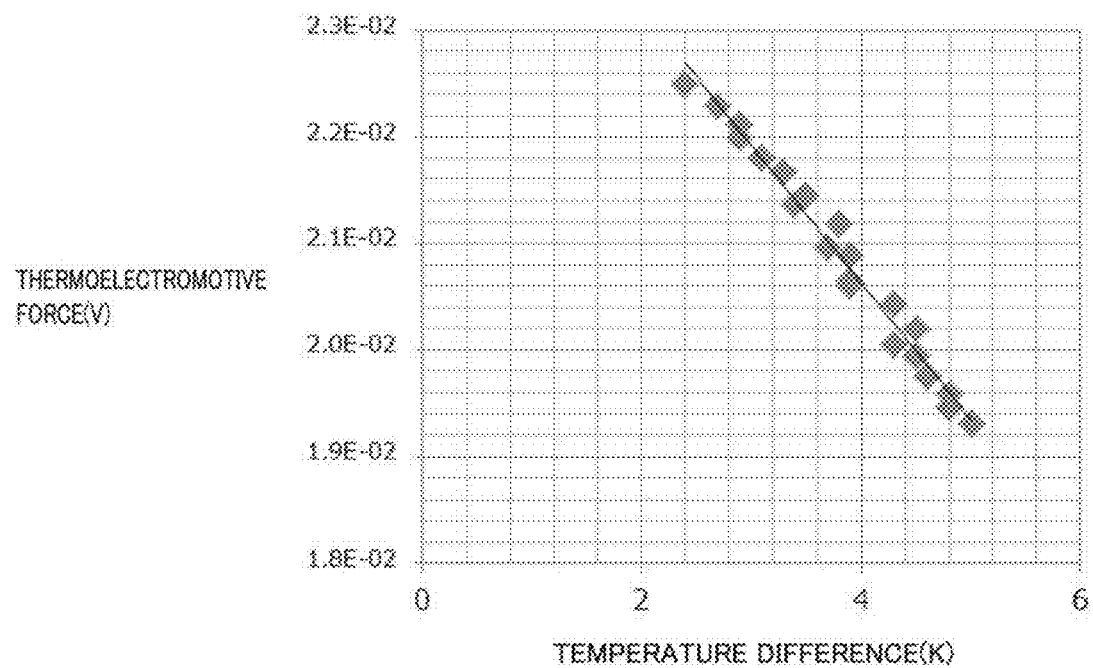
FIG. 24 is a diagram showing a result of measurement of thermoelectromotive force of sample S8.

Thermoelectromotive force was measured for samples S6 and sample S8 with the use of a thermoelectric characteristic measurement apparatus (a name of an apparatus: RZ2001i manufactured by Ozawa Science Co., Ltd.) by providing two electrodes on a surface and applying a temperature difference across the two electrodes. FIG. 23 shows a result of measurement for sample S6 and FIG. 24 shows a result of measurement for sample S8. Inclination of a graph of thermoelectromotive force shown in each of FIGS. 23 and 24 represents a Seebeck coefficient. It was found that, in use of sample S6, as shown in FIG. 23, when a temperature difference is not more than 1 K, a Seebeck coefficient of 2 mV/K was obtained and a high-performance thermoelectric material could be obtained. It was found that, in use of sample S8, as shown in FIG. 24, even when a temperature difference exceeding 4 K was caused, a Seebeck coefficient of 1.3 mV/K was obtained and a high-performance thermoelectric material could be obtained.

(Study About Thermoelectric Characteristics of Sample S6)

The reason why a difference in thermoelectric characteristics is caused in sample S6 between a case that a temperature difference is not more than 1 K and a case that a temperature difference is more than 1 K as shown in FIG. 23 will be studied. In sample S3, as shown in FIG. 22(a), Au precipitates as being concentrated in a portion of boundary with the sapphire substrate. It is expected that, when such an Au precipitated portion can electrically be conductive through an electrode portion and carriers, it forms a leak path and thermoelectric characteristics will lower. Specifically, a model shown in FIG. 25(a) and (b) is considered. FIG. 25(a) shows a model in which a temperature difference caused between electrodes 23 and 24 is small, specifically, a temperature difference is not more than 1 K. In this case, it is expected that unevenness in carriers 21 is minor and an Au precipitated portion 22 does not form a leak path. FIG. 25 (b) shows a model in which a temperature difference caused between electrodes 23 and 24 is great, specifically, the temperature difference exceeds 1 K. In this case, it is expected that unevenness in carriers 21 is significant and Au precipitated portion 22 may form a leak path.

[Example 1]

Nanoparticles were formed with the manufacturing method according to the third embodiment. Specifically, an uppermost layer composed of amorphous silicon (a-Si) and having a thickness of 30 nm was formed on a sapphire substrate. Then, in the stacking step, the first layer formed from the a-Ge layer/the Au layer/the a-Ge layer was deposited thereon in the stacking step to respective layer thicknesses of 1.1 nm/0.2 nm/1.1 nm, that is, to a total thickness of 2.4 nm, and the second layer formed from the a-Si layer was deposited to a thickness of 1.0 nm by thereafter depositing Si. Then, the step of stacking the first layer and the second layer was repeated 40 times. A concentration of atoms of Au in the first layer was set to 4.7 atomic %. Thereafter, the annealing step was performed by performing annealing treatment by leaving the stack for 15 minutes in an environment at 500° C. in an RTA furnace of a nitrogen atmosphere. Since desired particle size $X_d$ of nanoparticles was set to 5 nm and desired interparticle distance $G_d$ between nanoparticles was set to 3 nm, thickness $T_1$ of 2.4 nm of the first layer in the present example was determined to satisfy the expression (6) and thickness $T_2$ of 1.0 nm of the second layer was determined to satisfy the expression (7).

Bright-field STEM images of the stack after the stacking step and before the annealing step and of the stack after the annealing step were obtained with an electron microscope (a name of an apparatus: JEM-2100F manufactured by JEOL Ltd.). FIG. 26(a) shows an enlarged image of a stack portion including sapphire substrate 40 and uppermost layer 41 of the stack before the annealing step. FIG. 26(b) shows an enlarged image of a stack portion of a portion including sapphire substrate 40 and uppermost layer 41 of the stack after the annealing step. As can be seen in FIG. 26(a) and (b), it was confirmed that Au did not precipitate as being concentrated around the boundary of uppermost layer 41 and diffused in uppermost layer 41 even after the annealing step. The stack manufactured according to the present example was the same as sample S8 and hence exhibited the thermoelectric characteristics shown in FIG. 24.

As set forth above, according to the third embodiment of this invention, the thermoelectric material has such a construction that a different element diffuses in the uppermost layer (an uppermost portion) of the substrate body. This uppermost layer implements the support portion supporting a material containing nanoparticles. When the substrate body is formed from a stack constituted of an uppermost layer and a substrate (for example, a sapphire substrate), the uppermost layer implementing the support portion is provided between the substrate and the material containing nanoparticles. When a substrate body is formed of a single substance (for example, an Si substrate), the support portion is at least provided in the uppermost portion including a main surface where a material containing nanoparticles is formed. In any case, the support portion is formed of a material capable of forming a solid solution of a different element. Namely, the different element can diffuse in the support portion. Since a different element does not precipitate as being concentrated in a specific site in such a construction, formation of a leak path can be prevented. Thus, even when a temperature difference caused in a thermoelectric material is great, a high Seebeck coefficient can be obtained.

<Fourth Embodiment>

A construction of a thermoelectric element and a thermoelectric module formed with the thermoelectric material according to the first to third embodiments described above will be described in this embodiment.

Figure 27:
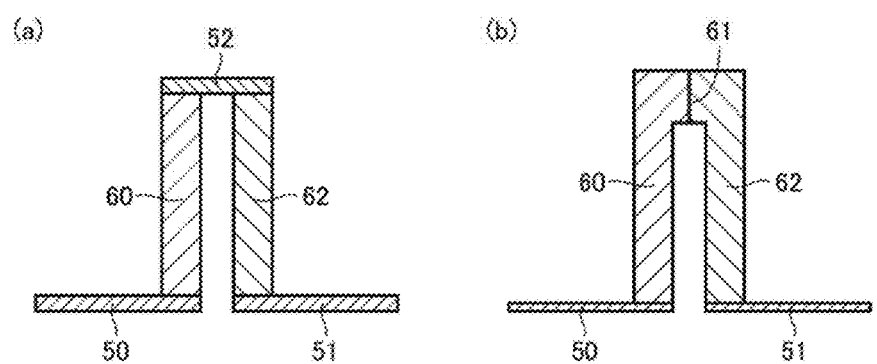
FIG. 27 is a cross-sectional view schematically showing a construction of a thermoelectric element according to a fourth embodiment of this invention.

FIG. 27 is a cross-sectional view schematically showing a construction of a thermoelectric element according to a fourth embodiment of this invention. Referring to FIG. 27(a), the thermoelectric element includes a p-type thermoelectric material 60, an n-type thermoelectric material 62, low-temperature side electrodes 50 and 51, and a high-temperature side electrode 52. P-type thermoelectric material 60 is formed by doping the thermoelectric material according to the first to third embodiments described above with a p-type impurity. For example, when a thermoelectric material is composed of SiGe, p-type thermoelectric material 60 is doped with B. N-type thermoelectric material 62 is formed by doping the thermoelectric material according to the first and second embodiments described above with an n-type impurity. For example, when a thermoelectric material is composed of SiGe, n-type thermoelectric material 62 is doped with P.

High-temperature side electrode 52 is joined to one end surface of p-type thermoelectric material 60 and one end surface of n-type thermoelectric material 62. Low-temperature side electrode 50 is joined to the other end surface of p-type thermoelectric material 60. Low-temperature side electrode 51 is joined to the other end surface of n-type thermoelectric material 62. A thermoelectric element obtained by combining p-type thermoelectric material 60 and n-type thermoelectric material 62 in series as above is referred to as a π-structure thermoelectric element. When a temperature difference is applied across high-temperature side electrode 52 and low-temperature side electrodes 50 and 51 in the π-structure thermoelectric element, thermal energy is converted to electric energy owing to the Seebeck effect, and thus a voltage is generated between low-temperature side electrodes 50 and 51.

The π-structure thermoelectric element may be constructed such that p-type thermoelectric material 60 and n-type thermoelectric material 62 are directly joined to each other without high-temperature side electrode 52 being interposed as shown in FIG. 27(b). In this case, a voltage in accordance with a temperature difference between a joint portion 61 between p-type thermoelectric material 60 and n-type thermoelectric material 62 and low-temperature side electrodes 50 and 51 is generated.

Figure 28:
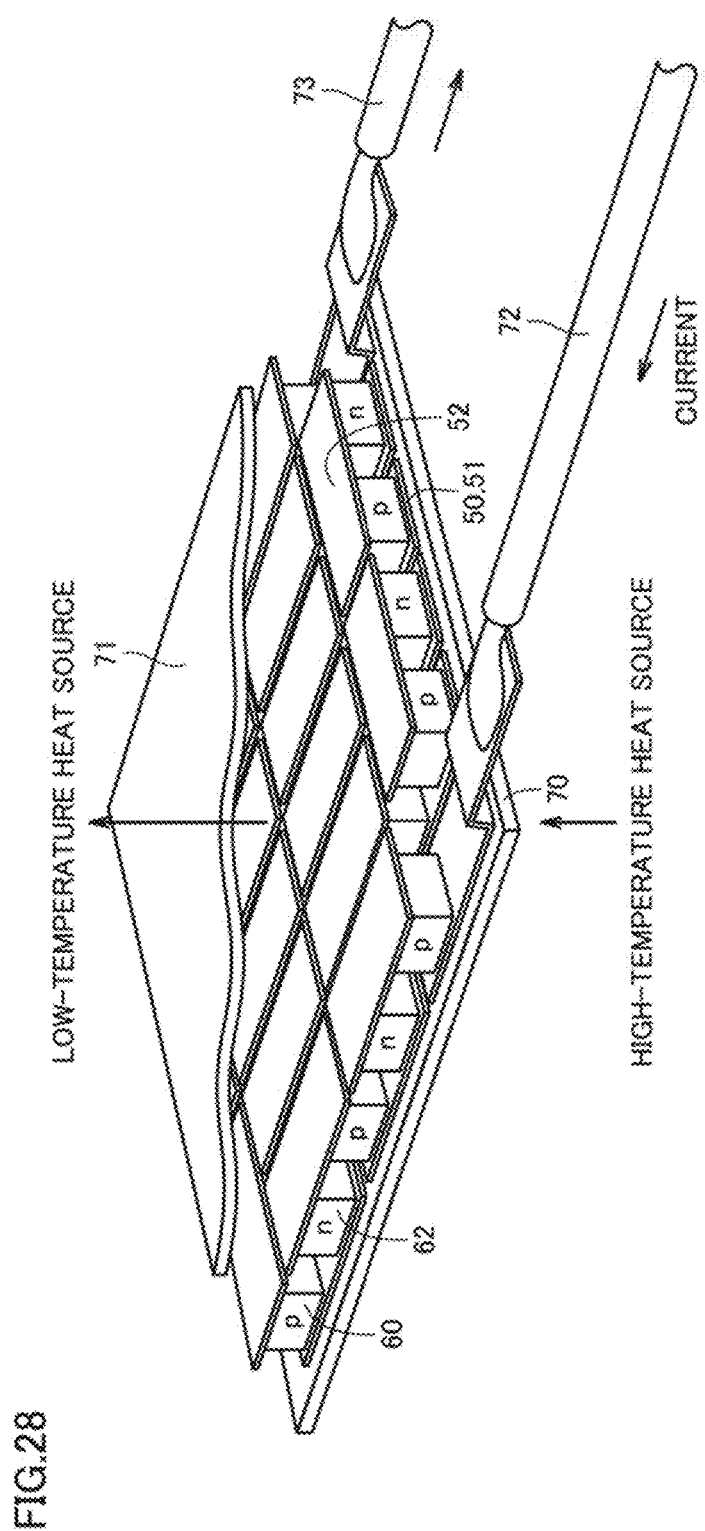
FIG. 28 is a partially cut-away perspective view showing a construction example of a thermoelectric module.

By connecting a plurality of π-structure thermoelectric elements in series, a thermoelectric module as shown in FIG. 28 can be formed. The thermoelectric module achieves high conversion efficiency by applying the thermoelectric material having good thermoelectric characteristics. FIG. 28 is a partially cut-away perspective view showing a construction example of the thermoelectric module.

Referring to FIG. 28, the thermoelectric module is constructed by joining p-type thermoelectric material 60 and n-type thermoelectric material 62 by alternately electrically connecting the p-type thermoelectric material and the n-type thermoelectric material in series, between a pair of insulator substrates 70 and 71. Performance of the thermoelectric module can be adjusted by performance, a size, and the number of pairs to be incorporated (the number of pairs), of p-type thermoelectric material 60 and n-type thermoelectric material 62.

A pair of insulator substrates 70 and 71 is formed, for example, of alumina or ceramics. An electrode pattern is formed on an upper surface of lower insulator substrate 70 with such a method as plating. A pair of p-type thermoelectric material 60 and n-type thermoelectric material 62 is mounted on an upper surface of each independent electrode pattern, with solder being interposed.

A similar electrode pattern is formed also on a lower surface of upper insulator substrate 71, and an upper electrode pattern is arranged as being relatively displaced from a lower electrode pattern. Consequently, a plurality of p-type thermoelectric materials 60 and n-type thermoelectric materials 62 joined between a plurality of lower electrode patterns and a plurality of upper electrode patterns with solder being interposed are alternately electrically connected in series.

On lower insulator substrate 70, in order to supply electric power to the thermoelectric module, an electrode pattern connected to one p-type thermoelectric material 60 and an electrode pattern connected to one n-type thermoelectric material 62 are paired and at least one such pair is connected in series or in parallel, and one lead 72 is attached to an electrode material connected to at least one p-type thermoelectric material with solder and one lead 73 is attached to an electrode material connected to at least one n-type thermoelectric material with solder.

Figure 29:
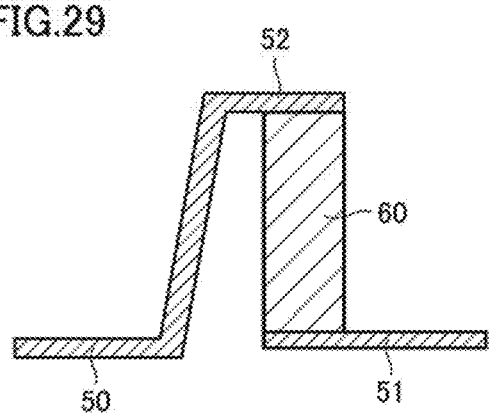
FIG. 29 is a cross-sectional view schematically showing another construction of a thermoelectric element according to the fourth embodiment of this invention.

The thermoelectric element according to this embodiment is not limited to the π-structure thermoelectric element as above, and may be implemented only with p-type thermoelectric material 60 as shown in FIG. 29. FIG. 29 is a cross-sectional view schematically showing another construction of a thermoelectric element according to the fourth embodiment of this invention. Referring to FIG. 29, the thermoelectric element includes p-type thermoelectric material 60, high-temperature side electrode 52, and low-temperature side electrode 51. P-type thermoelectric material 60 is formed by doping the thermoelectric material according to the first to third embodiments described above with a p-type impurity. For example, when a thermoelectric material is composed of SiGe, p-type thermoelectric material 60 is doped with B.

High-temperature side electrode 52 is joined to one end surface of p-type thermoelectric material 60, and low-temperature side electrode 51 is joined to the other end surface of p-type thermoelectric material 60. Such a thermoelectric element including only p-type thermoelectric material 60 is referred to as a uni-leg thermoelectric element. The uni-leg thermoelectric element may be implemented only with an n-type thermoelectric material. By connecting a plurality of uni-leg thermoelectric elements in series, a thermoelectric module as shown in FIG. 28 can be formed.

<Fifth Embodiment>

A construction of an optical sensor formed of the thermoelectric material according to the first to third embodiments described above will be described in this embodiment.

Figure 30:
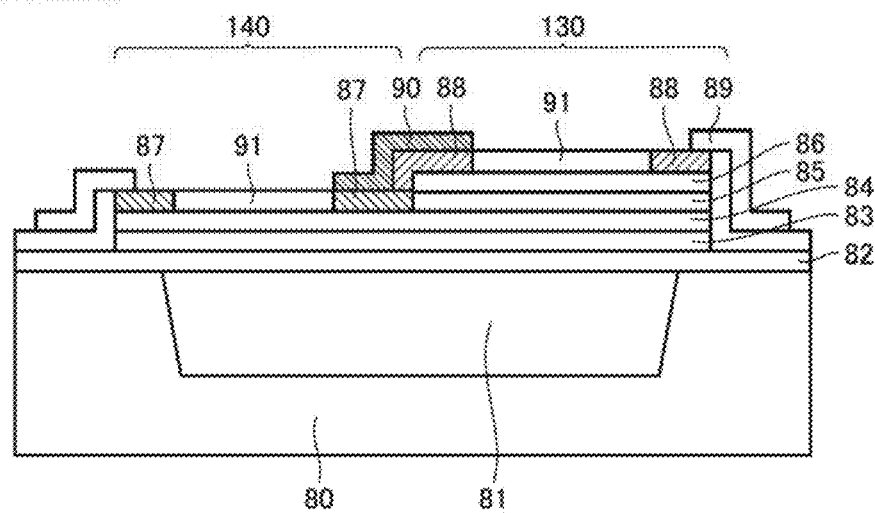
FIG. 30 is a cross-sectional view of an optical sensor according to a fifth embodiment of this invention.

FIG. 30 is a cross-sectional view of an optical sensor according to a fifth embodiment of this invention. Referring to FIG. 30, the optical sensor includes a p-type thermoelectric conversion portion 130 and an n-type thermoelectric conversion portion 140 which are formed on a substrate 80 composed of $SiO_2$.

On substrate 80, an etching stop layer 82 composed on SiN, an n-type thermoelectric material 83, an $n^+$ type ohmic contact layer 84, an insulator layer 85 composed of $SiO_2$, and a p-type thermoelectric material 86 are successively stacked. N-type thermoelectric material 83 is formed by doping the thermoelectric material according to the first to third embodiments described above with an n-type impurity. For example, when the thermoelectric material is composed of SiGe, n-type thermoelectric material 83 is doped with P. P-type thermoelectric material 86 is formed by doping the thermoelectric material according to the first to third embodiments described above with a p-type impurity. For example, when the thermoelectric material is composed of SiGe, p-type thermoelectric material 86 is doped with B.

In p-type thermoelectric conversion portion 130, a p-type ohmic contact layer 88 is formed on p-type thermoelectric material 86 on opposing sides. Si doped with B is used for p-type ohmic contact layer 88. A protection film 91 is formed on p-type thermoelectric material 86 between p-type ohmic contact layers 88. In n-type thermoelectric conversion portion 140, p-type thermoelectric material 86 and insulator layer 85 are removed, and an n-type ohmic contact layer 87 is formed on n-type thermoelectric material 84 on opposing sides. Protection film 91 composed of $SiO_2$ is formed above n-type thermoelectric material 83 between n-type ohmic contact layers 87. Si doped with P is used for n-type ohmic contact layer 87 and n$^+$type ohmic contact layer 84.

An absorber 90 is provided on p-type ohmic contact layer 88 and n-type ohmic contact layer 87 on a side where p-type thermoelectric conversion portion 130 and n-type thermoelectric conversion portion 140 are in contact with each other. A heat absorption pad 89 is provided on the other p-type ohmic contact layer 88 and the other n-type ohmic contact layer 87. Titanium (Ti) is used for absorber 90 and Au/Ti is used for heat absorption pad 89. A cavity 81 is provided in substrate 80 under p-type thermoelectric conversion portion 130 and n-type thermoelectric conversion portion 140.

P-type thermoelectric conversion portion 130 and n-type thermoelectric conversion portion 140 shown in FIG. 30 can be manufactured, for example, in accordance with a method shown below. Initially, etching stop layer 82 is formed on substrate 80 with plasma CVD. For example, an insulator composed of SiN or the like having a film thickness of 0.5 μm is deposited with CVD at 400° C. Then, n-type thermoelectric material 83, n$^+$ type ohmic contact layer 84, insulator layer 85, and p-type thermoelectric material 86 are stacked on etching stop layer 82 with EB. This thin film material is subjected to annealing treatment for 15 minutes at a temperature of 600° C. in a nitrogen ($N_2$) atmosphere. Nanoparticles are thus formed in a base material in n-type thermoelectric material 83 and p-type thermoelectric material 86.

Then, p-type ohmic contact layer 88 in a prescribed portion is removed by etching (for example, dry etching with $CF_4$) after a resist film is formed in the prescribed portion on a surface of the thin film material with photolithography. P-type thermoelectric material 86 and insulator layer 85 in a region to be n-type thermoelectric conversion portion 140 are removed by etching with a resist film being formed again on a prescribed portion.

Then, absorber 90 and heat absorption pad 89 are formed with vapor deposition as being combined with a resist and lift-off. Thereafter, cavity 81 is formed by etching (for example, dry etching with $CF_4$) substrate 80 under etching stop layer 82, with a prescribed portion being masked.

As the optical sensor is irradiated with light (including far-infrared light), absorber 90 arranged in the center absorbs light and a temperature thereof increases. Owing to a temperature difference between absorber 90 and heat absorption pad 89, thermoelectric conversion owing to the Seebeck effect by p-type thermoelectric conversion portion 130 and n-type thermoelectric conversion portion 140 is carried out. Thus, in p-type thermoelectric conversion portion 130, electromotive force is produced between p-type ohmic contact layers 88. In n-type thermoelectric conversion portion 140, electromotive force is produced between n-type ohmic contact layers 87. Light can thus be sensed.

Though the optical sensor includes p-type thermoelectric conversion portion 130 and n-type thermoelectric conversion portion 140 in FIG. 30, similar effects can be achieved by an optical sensor including any one of p-type thermoelectric conversion portion 130 and n-type thermoelectric conversion portion 140.

It should be understood that the embodiments disclosed herein are illustrative and non-restrictive in every respect. The scope of the present invention is defined by the terms of the claims, rather than the embodiments above, and is intended to include any modifications within the scope and meaning equivalent to the terms of the claims.

INDUSTRIAL APPLICABILITY

This invention is particularly effectively applied to a thermoelectric material, as well as a thermoelectric element, a thermoelectric module, and an optical sensor including the same.

REFERENCE SIGNS LIST 1 substrate; 2 semiconductor layer (quantum well layer); 3 semiconductor layer (energy barrier layer); 5 wire; 5A nanowire array; 5B round rod material; 6 first semiconductor member; 7 second semiconductor member; 10, 20 thermoelectric material; 21 carrier; 22 Au precipitated portion; 23, 24 electrode; 30 quantum dot (nanoparticle); 32 wave function; 40 sapphire substrate; 41 uppermost layer; 42 first layer; 43, 45 amorphous Ge layer; 44 Au layer; 46 second layer; 48 substrate body; 50, 51 low-temperature side electrode; 52 high-temperature side electrode; 60, 86 p-type thermoelectric material; 61 joint portion; 62, 83 n-type thermoelectric material; 70, 71 insulator substrate; 73 lead; 80 substrate; 81 cavity; 82 etching stop layer; 84 n$^+$ type ohmic contact layer; 85 insulator layer; 88 p-type ohmic contact layer; 89 heat absorption pad; 90 absorber; 91 protection film; 100 heating furnace; 110 roller; 120 winding drum; 130 p-type thermoelectric conversion portion; and 140 n-type thermoelectric conversion portion.

The invention claimed is:
1. A thermoelectric material comprising:
a plurality of first semiconductor members having first band gap energy; and
a second semiconductor member having second band gap energy higher than the first band gap energy,
the first semiconductor members each having a width in a direction of carrier transport not greater than 5 nm and a distance between two adjacent first semiconductor members in the direction of carrier transport being not greater than 3 nm,
the plurality of first semiconductor members forming a plurality of quantum dots comprising a first base material element, a second base material element different from the first base material element, and a different element different from the first and second base material elements,
the second semiconductor member forming a base material comprising the first and second base material elements in which the plurality of the quantum dots are distributed,
the thermoelectric material further comprising a substrate body disposed at a base of the base material and having a support portion, the support portion supporting the base material containing the plurality of quantum dots and the support portion is formed of a material being capable of forming a solid solution of the different element, and the different element being diffused in the support portion.

2. The thermoelectric material according to claim 1, wherein
an interparticle distance between the quantum dots is not greater than 3 nm.

3. The thermoelectric material according to claim 1, wherein
the quantum dots are nanoparticles,
the first base material element is one of Si and Ge, the second base material element is the other of Si and Ge, and
the different element is one of Au, Cu, B, or Al.

4. The thermoelectric material according to claim 1, wherein
a ratio of crystallization of the thermoelectric material is not lower than 45%.

5. The thermoelectric material according to claim 1, wherein
an image obtained by subjecting an image resulting from observation of the thermoelectric material with a transmission electron microscope to fast Fourier transform has a moiré.

6. The thermoelectric material according to claim 1, wherein the quantum dots are nanoparticles, the substrate body has a material containing the nanoparticles formed on a main surface of the substrate body, and the support portion is provided between the main surface of the substrate body and the material containing the nanoparticles.

7. The thermoelectric material according to claim 1, wherein the quantum dots are nanoparticles, the substrate body has a material containing the nanoparticles formed on a main surface of the substrate body, and the support portion is at least provided in an uppermost portion of the substrate body including the main surface.

8. The thermoelectric material according to claim 1, wherein
the different element is diffused in the support portion.

9. A thermoelectric module comprising:
a thermoelectric element; and
a pair of insulator substrates sandwiching the thermoelectric element,
the thermoelectric element including
the thermoelectric material according to claim 1, the thermoelectric material being doped to a p-type or an n-type, and
an electrode joined to the thermoelectric material in the direction of carrier transport.

10. An optical sensor comprising:
an absorber configured to absorb light and convert light to heat; and
a thermoelectric converter connected to the absorber,
the thermoelectric converter including the thermoelectric material according to claim 1, the thermoelectric material being doped to a p-type or an n-type.

* * * * *